(12) United States Patent  
Li et al.

(10) Patent No.: US 9,881,690 B2  
(45) Date of Patent: Jan. 30, 2018

(54) SHIFT REGISTER UNIT, GATE DRIVER CIRCUIT AND DISPLAY PANEL

(71) Applicant: BOE TECHNOLOGY GROUP CO., LTD., Beijing (CN)

(72) Inventors: Quanhu Li, Beijing (CN); Zhongyuan Wu, Beijing (CN); Kun Cao, Beijing (CN); Baoxia Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 124 days.

(21) Appl. No.: 15/135,911

(22) Filed: Apr. 22, 2016

(65) Prior Publication Data

US 2017/0039950 A1 Feb. 9, 2017

(30) Foreign Application Priority Data

Aug. 5, 2015 (CN) .............................. 201510475798

(51) Int. Cl.
| | |
|---|---|
| *G11C 19/00* | (2006.01) |
| *G11C 19/28* | (2006.01) |
| *G09G 3/3266* | (2016.01) |
| *G09G 3/36* | (2006.01) |

(52) U.S. Cl.  
CPC ............ *G11C 19/28* (2013.01); *G09G 3/3266* (2013.01); *G09G 3/3677* (2013.01); *G09G 2300/0408* (2013.01); *G09G 2310/0286* (2013.01)

(58) Field of Classification Search  
None  
See application file for complete search history.

(56) References Cited

U.S. PATENT DOCUMENTS

| | | | |
|---|---|---|---|
| 2014/0079173 A1* | 3/2014 | Yan ................... | G11C 19/28 377/64 |
| 2015/0255031 A1* | 9/2015 | Cao .................... | G09G 3/3648 345/210 |
| 2016/0275845 A1* | 9/2016 | Tsai ................... | G09G 3/3266 |
| 2016/0372031 A1* | 12/2016 | Li ...................... | G09G 3/3225 |
| 2017/0025057 A1* | 1/2017 | Li ...................... | G09G 3/2092 |
| 2017/0039930 A1* | 2/2017 | Li ...................... | G09G 3/20 |
| 2017/0069286 A1* | 3/2017 | Wu .................... | G09G 3/20 |

* cited by examiner

*Primary Examiner* — Tuan T Lam  
(74) *Attorney, Agent, or Firm* — Armstrong Teasdale LLP

(57) ABSTRACT

A shift register unit having a pulse width modulation module is provided. The pulse width modulation module includes a first input submodule, a first pull-down submodule, a second input submodule, a second pull-down submodule, a third input submodule, and a third pull-down submodule.

25 Claims, 8 Drawing Sheets

SHIFT REGISTER UNIT, GATE DRIVER CIRCUIT AND DISPLAY PANEL

CROSS REFERENCE TO RELATED APPLICATIONS

The present application claims priority to Chinese Patent Application No. 201510475798.X filed on Aug. 5, 2015, the disclosure of which is incorporated herein by reference in its entirety.

BACKGROUND

The present invention relates to display technology, and more particularly, to a shift register unit, a gate driving circuit and a display panel.

With the continuous development of display technology, a display device such as an Organic Light Emitting Diode (OLED) display device has been increasingly used in high performance display field due to its small volume, low power consumption, no radiation, and low manufacturing cost.

Within the effective display area of a display panel of such a display device, there is provided pixel cells arranged in a matrix defined by intersecting a plurality of gate lines and a plurality of data lines. The peripheral area of the display panel is provided with a gate driving circuit for conducting a line-by-line scan on the gate lines. Through a line-by-line scan, the pixel cells are turned on line-by-line, and then the turned on pixel cells may be charged through the data lines. The current gate driving circuit usually integrates a gate switch circuit of a Thin Film Transistor (TFT) onto the display panel by means of a Gate Driver on Array (GOA) technology.

In recent years, the display panel has evolved towards large size, high resolution and high frame rate. However, as the size and resolution of the display panel increases, the number of the pixel cells in each row and each column on the display panel will increase accordingly. In this case, if frame rate is increased, scanning time for pixel cells in each row will be reduced, thus charging of the pixel cells will be insufficient.

For this reason, a solution has been proposed in which a plurality of clock signals are connected to a plurality of shift registers such that the scanning signals of two adjacent rows overlap with each other to pre-charge the pixel cells. Furthermore, by changing the internal structure of the shift registers and adjusting the clock signals, the width of the overlapped region can be changed. However, the wider the overlapped region is, the more the clock signals are required to be connected to the shift registers. Thus, the area for deploying the gate driving circuit is increased, and the complexity of the display panel is increased, which is not advantageous to achieve a narrow frame of the display panel.

BRIEF DESCRIPTION

Embodiments of the present disclosure provide a shift register unit, a gate driving circuit and a display panel, which can realize the pre-charging of the pixel cells in the display panel, and adjust the pre-charge time without increasing the area for deploying the gate driving circuit, and facilitate the narrow frame of a display panel.

According to an aspect of the present disclosure, there is provided a shift register unit that includes a pulse width modulation module. The pulse width modulation module includes a first input submodule, a first pull-down submodule, a second input submodule, a second pull-down submodule, a third input submodule and a third pull-down submodule. The first input submodule is inputted with a first control signal via a first control signal terminal, a second control signal via a second control signal terminal, a third control signal via a third control signal terminal, a second clock signal via a second clock signal terminal, and a first voltage signal via a first voltage terminal. Under the control of the second control signal and the third control signal, the first control signal is outputted via a first output terminal as a first output signal. The first pull-down submodule is inputted with a first clock signal via a first clock signal terminal, and is inputted with the first control signal and the first voltage signal. Under the control of the first clock signal and the first control signal, a voltage of the first output signal is pulled down to be identical to a voltage of the first voltage signal. The second input submodule is inputted with the first clock signal and the second clock signal, and outputs the first clock signal or the second signal via a second output terminal as a second output signal. The second pull-down submodule is inputted with the first output signal, the second output signal and the first voltage signal. Under the control of the first output signal, a voltage of the second output signal is pulled down to be identical to a voltage of the first voltage signal. The third input submodule is inputted with the first control signal and the first output signal, and is inputted with a third voltage signal via a third voltage terminal. Under the control of the first control signal and the first output signal, the third voltage signal is outputted via a third output terminal as a third output signal. The third pull-down submodule is inputted with the second output signal, the first voltage signal and the third output signal. Under the control of the second output signal, a voltage of the third output signal is pulled down to be identical to a voltage of the first voltage signal.

In an embodiment of the present disclosure, the pulse width modulation module may further include a feedback submodule, which is inputted with the first output signal, the second output signal and the third voltage signal, and is inputted with a second voltage signal via a second voltage terminal. Under the control of the first output signal, the third voltage signal is outputted to the first input submodule as a feedback signal. Under the control of the second output signal, the second voltage signal is outputted to the first pull-down submodule as a feedback signal.

In another embodiment of the present disclosure, the first input submodule may include a first transistor, a second transistor and a third transistor. A gate of the first transistor is connected to a second electrode of the second transistor, a first electrode thereof is connected to the first output terminal, and a second electrode thereof is connected to the first control signal terminal. A gate of the second transistor is connected to the third control signal terminal, and a first electrode thereof is connected to the second clock signal terminal. A gate of the third transistor is connected to the second control signal terminal, a first electrode thereof is connected to the first voltage terminal, and a second electrode thereof is connected to the second electrode of the second transistor.

In another embodiment of the present disclosure, the first pull-down submodule may include a sixth transistor, a seventh transistor and an eighth transistor. A gate of the sixth transistor is connected to a first electrode of the seventh transistor, a first electrode thereof is connected to the first voltage terminal, and a second electrode thereof is connected to the first output terminal. A gate and a second electrode of the seventh transistor are each connected to the first clock signal terminal, and a first electrode thereof is connected to a second electrode of the eighth transistor. A gate of the eighth transistor is connected to the first control signal, and a first electrode thereof is connected to the first voltage terminal.

In another embodiment of the present disclosure, the second input submodule may include a tenth transistor and a eleventh transistor. A gate and a first electrode of the tenth transistor are each connected to the first clock signal terminal, and a second electrode thereof is connected to the second output terminal. A gate and a second electrode of the eleventh transistor are each connected to the second clock signal terminal, and a first electrode thereof is connected to the second output terminal.

In another embodiment of the present disclosure, the second pull-down submodule may include a twelfth transistor, a gate thereof is connected to the first output terminal, a first electrode thereof is connected to the second output terminal, and a second electrode thereof is connected to the first voltage terminal.

In another embodiment of the present disclosure, the third output submodule may include a first capacitor and a thirteenth transistor. A gate of the thirteenth transistor is connected to the first output terminal, a first electrode thereof is connected to the third voltage terminal, and a second electrode thereof is connected to the third output terminal. The first capacitor is connected between the first control signal terminal and gate of the thirteenth transistor.

In another embodiment of the present disclosure, the third pull-down submodule may include a second capacitor and a fourteenth transistor. A gate of the fourteenth transistor is connected to the second output terminal, a first electrode thereof is connected to the third output terminal, and a second electrode thereof is connected to the first voltage terminal. The second capacitor is connected between the first output terminal and the gate of the fourteenth transistor.

In another embodiment of the present disclosure, the feedback submodule may include a fifteenth transistor and a sixteenth transistor. A gate of the fifteenth transistor is connected to the first output terminal, a first electrode thereof is connected to the third voltage terminal, and a second electrode thereof is connected to the first input submodule and the first pull-down submodule. A gate of the sixteenth transistor is connected to the second output terminal, a second electrode thereof is connected to the second voltage terminal, and a first electrode thereof is connected to the first input submodule and the first pull-down submodule.

In another embodiment of the present disclosure, the first input submodule may include a first transistor, a second transistor, a third transistor, a fourth transistor and a fifth transistor. A gate of the first transistor is connected to a second electrode of the second transistor, a first electrode thereof is connected to a second electrode of the fifth transistor, and a second electrode thereof is connected to the first control signal terminal. A gate of the second transistor is connected to the third control signal terminal, and a first electrode thereof is connected to the second clock signal terminal. A gate of the third transistor is connected to the second control signal terminal, a first electrode thereof is connected to the first voltage terminal, and a second electrode thereof is connected to the second electrode of the second transistor. A gate of the fourth transistor is connected to the first clock signal terminal, a first electrode thereof is connected to the second electrode of the second transistor, and a second electrode thereof is connected to the first voltage terminal. A gate of the fifth transistor is connected to the second electrode of the second transistor, and a first electrode thereof is connected to the first output terminal.

In another embodiment of the present disclosure, the first pull-down submodule may include a sixth transistor, a seventh transistor, an eighth transistor and a ninth transistor. A gate of the sixth transistor is connected to a first electrode of the seventh transistor, a first electrode thereof is connected to the first voltage terminal, and a second electrode thereof is connected to a first electrode of the ninth transistor. A gate and a second electrode of the seventh transistor are each connected to the first clock signal terminal, and a first electrode thereof is connected to a second electrode of the eighth transistor. A gate of the eighth transistor is connected to the first control signal terminal, and a first electrode thereof is connected to the first voltage terminal. A gate of the ninth transistor is connected to the first electrode of the seventh transistor, and a second electrode thereof is connected to the first output terminal.

In another embodiment of the present disclosure, the shift register unit further includes a multi-pulse output module connected to the pulse width modulation module to be inputted with the first output signal, the second output signal and the third output signal, to be inputted with the third clock signal via the third clock signal terminal, and to be inputted with the second voltage signal. Under the control of the first output signal, the second output signal and the third output signal, the multi-pulse output module outputs a multi-pulse signal via a driving signal output terminal. A width of the multi-pulse signal matches a width of the first output signal or the second output signal or the third output signal, and a frequency of the multi-pulse signal matches a frequency of the third clock signal.

In another embodiment of the present disclosure, the multi-pulse output module may include a seventeenth transistor, an eighteenth transistor, a nineteenth transistor, a twentieth transistor, a twenty-first transistor and a third capacitor. A gate of the seventeenth transistor is connected to the first output terminal, a first electrode thereof is connected to the third clock signal terminal, and a second electrode thereof is connected to a second electrode of the eighteenth transistor. A gate of the eighteenth transistor is connected to the second output terminal, and a first electrode thereof is connected to the second voltage terminal. A gate of the nineteenth transistor is connected to the third output terminal, a first electrode thereof is connected to the first input submodule, and a second electrode thereof is connected to the second electrode of the seventeenth transistor and the second electrode of the eighteenth transistor. A gate of the twentieth transistor is connected to the first output terminal, a first electrode thereof is connected to the third clock signal terminal, and a second electrode thereof is connected to the driving signal output terminal. A gate of the twenty-first transistor is connected to the second output terminal, a first electrode thereof is connected to the second voltage terminal, and a second electrode thereof is connected to the driving signal output terminal. The third capacitor is connected between gate of the twentieth transistor and the driving signal output terminal.

In another embodiment of the present disclosure, the shift register unit may further include a gating module and a mono-pulse signal output module. One end of the gating module is connected to the multi-pulse output module, and the other end is connected to the mono-pulse signal output module, and the gating module is configured to gate a mono-pulse signal outputted by the mono-pulse signal output module after gating a multi-pulse signal outputted by the multi-pulse output module.

In another embodiment of the present disclosure, the shift register unit may further include a multi-pulse output module and a high-frequency reverse module. The multi-pulse output module is connected to the pulse width modulation module to be inputted with the first output signal and the second output signal, and to be inputted with the third clock signal and the first voltage signal. Under the control of the first output signal and the second output signal, the multi-pulse output module outputs a multi-pulse signal. The high-frequency reverse module is connected to the multi-pulse output module, is inputted with a fourth clock signal via a fourth clock signal terminal, and is inputted with the third voltage signal, the first voltage signal and the second voltage signal. The high-frequency reverse module reverses the multi-pulse signal under the control of the fourth clock signal, and outputs the reversed multi-pulse signal via the driving signal output terminal. A width of the reversed multi-pulse signal matches a pulse width of the first output signal or the second output signal, and a frequency of the reversed multi-pulse signal matches a frequency of the third clock signal.

In another embodiment of the present disclosure, the multi-pulse output module includes a seventeenth transistor and an eighteenth transistor. A gate of the seventeenth transistor is connected to the first output terminal, a first electrode thereof is connected to the third clock signal terminal, and a second electrode thereof is connected to the high-frequency reverse module. A gate of the eighteenth transistor is connected to the second output terminal, a first electrode thereof is connected to the first voltage terminal, and a second electrode thereof is connected to the high-frequency reverse module.

In another embodiment of the present disclosure, the high-frequency reverse module includes a nineteenth transistor, a twentieth transistor, a twenty-first transistor, a twenty-second transistor, a twenty-third transistor, a twenty-fourth transistor, a third capacitor, a fourth capacitor and a resistor. A gate of the nineteenth transistor is connected to the fourth clock signal terminal, a first electrode thereof is connected to the third voltage terminal, and a second electrode thereof is connected to a first electrode of the twentieth transistor. A gate of the twentieth transistor is connected to gate of the twenty-first transistor and the multi-pulse output module, and a second electrode thereof is connected to the second voltage terminal. A first electrode of the twenty-first transistor is connected to the third voltage terminal, and a second electrode thereof is connected to a gate of the twenty-fourth transistor. A gate of the twenty-second transistor is connected to a second electrode of the nineteenth transistor, a first electrode thereof is connected to gate of the twenty-fourth transistor, and a second electrode thereof is connected to the first voltage terminal. A gate of the twenty-third transistor is connected to the second electrode of the nineteenth transistor, a first electrode thereof is connected to the third voltage terminal, and a second electrode thereof is connected to the driving signal output terminal. A first electrode of the twenty-fourth transistor is connected to the driving signal output terminal, and a second electrode thereof is connected to the second voltage terminal. The third capacitor is connected between gate of the twenty-third transistor and the second electrode of the twenty-third transistor. The resistor and the fourth capacitor are connected in series between the driving signal output terminal and a ground terminal.

In another embodiment of the present disclosure, the shift register unit further includes a reverse module connected to the pulse width modulation module to be inputted with the first output signal and the second output signal, to be inputted with the second voltage signal via the second voltage terminal, to be inputted with the fifth voltage signal via the fifth voltage terminal, and to be inputted with the first voltage signal and the third voltage signal. Under the control of the third clock signal, the first output signal and the second output signal, the reverse module outputs a reversed mono-pulse signal via the driving signal output terminal. A width of the reversed mono-pulse signal matches a pulse width of the first output signal of the second output signal, and an amplitude of the reversed mono-pulse signal matches an amplitude of the fifth voltage signal.

In another embodiment of the present disclosure, the reverse module includes a seventeenth transistor, an eighteenth transistor, a nineteenth transistor, a twentieth transistor, a twenty-first transistor, a twenty-second transistor, a twenty-third transistor, a twenty-fourth transistor, a twenty-fifth transistor, a third capacitor, a fourth capacitor and a resistor. A gate of the seventeenth transistor is connected to the first output terminal, a first electrode thereof is connected to the third clock signal terminal, and a second electrode thereof is connected to a second electrode of the eighteenth transistor. A gate of the eighteenth transistor is connected to the second output terminal, and a first electrode thereof is connected to the first voltage terminal. A gate and a first electrode of the nineteenth transistor are each connected to the third voltage terminal, and a second electrode thereof is connected to a first electrode of the twentieth transistor. A gate of the twentieth transistor is connected to the second electrode of the seventeenth transistor and the second electrode of the eighteenth transistor, and a second electrode thereof is connected to the second voltage terminal. A gate and a first electrode of the twenty-first transistor are each connected to the third voltage terminal, and a second electrode thereof is connected to the second electrode of the nineteenth transistor and the first electrode of the twentieth transistor. A gate of the twenty-second transistor is connected to a gate of the twentieth transistor, a first electrode thereof is connected to the third voltage terminal, and a second electrode thereof is connected to a first electrode of the twenty-third transistor. A gate of the twenty-third transistor is connected to the second electrode of the nineteenth transistor and the first electrode of the twentieth transistor, a first electrode thereof is connected to the second electrode of the twenty-second transistor, and a second electrode thereof is connected to the first voltage terminal. A gate of the twenty-fourth transistor is connected to the second electrode of the nineteenth transistor and the first electrode of the twentieth transistor, a first electrode thereof is connected to the fifth voltage terminal, and a second electrode thereof is connected to the driving signal output terminal. A gate of the twenty-fifth transistor is connected to the second electrode of the twenty-second transistor and the first electrode of the twenty-third transistor, a first electrode thereof is connected to the fourth voltage terminal, and a second electrode thereof is connected to the driving signal output terminal. The third capacitor is connected between gate of the twenty-fourth transistor and the second electrode of the twenty-fourth transistor. The resistor and the fourth capacitor are connected in series between the driving signal output terminal and a ground terminal.

In another aspect of the present disclosure, there is provided a gate driving circuit that includes at least two cascaded shift register units as described above. The first control signal for a first stage of shift register unit is provided by a first control signal source. The third output signal of another stage of shift register unit than the last stage of the shift register unit is used as the first control signal for its next stage of the shift register unit. The third output signal of the other stage of the shift register unit than the first stage shift register unit is used as the second control signal for its previous stage of the shift register unit. The second control signal of the last stage of the shift register unit is the first voltage signal. The second output signal of the other stage of the shift register unit than the first stage of the shift register unit is used as the third control signal for its previous stage of the shift register unit. The third control signal of the last stage shift of the register unit is the first voltage signal.

In another aspect of the present disclosure, there is provided a display panel that includes the gate driving circuit as above described.

BRIEF DESCRIPTION OF THE DRAWINGS

To illustrate the technical solution of embodiments of the disclosure more clearly, drawings of the embodiments will be briefly described below. It should be appreciated that the below described drawings are merely some of the embodiments of the disclosure, and are not limitations on the present disclosure.

DETAILED DESCRIPTION

To make the technical solutions and advantages of embodiments of the disclosure more apparent, the technical solutions of the embodiments disclosure will be described below clearly and completely in connection with the drawings. The described embodiments are for example purposes, and are not intended to limit the scope of the disclosure. Based on the described embodiments, all other embodiments obtained by those skilled in the art without inventive work are within the protective scope of the disclosure.

Figure 1:
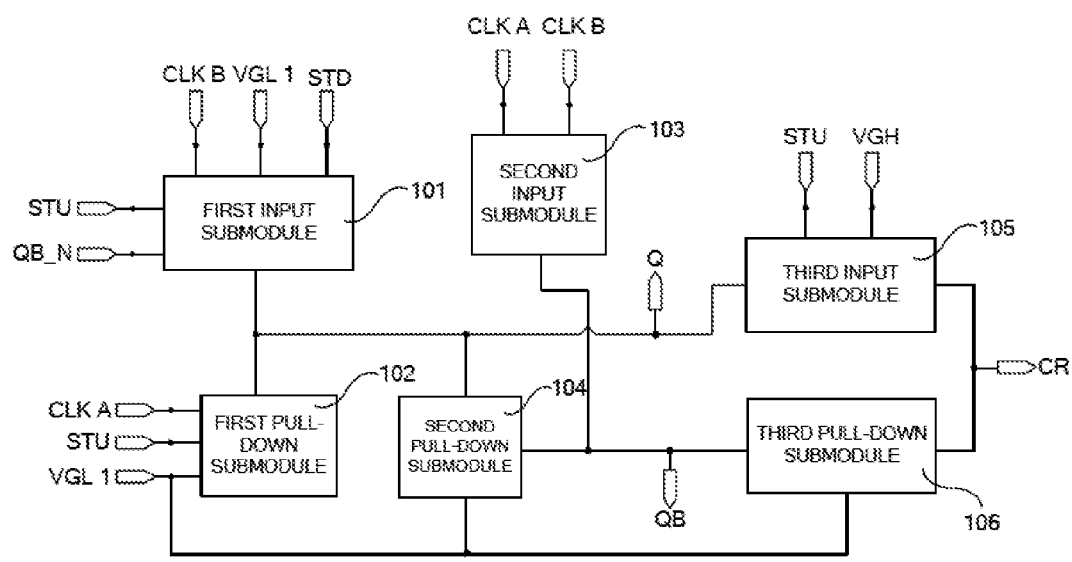
FIG. 1 is a schematic block diagram of the shift register unit according to a first embodiment of the present disclosure.

FIG. 1 shows a schematic block diagram of a shift register unit according to a first embodiment of the present disclosure. In this embodiment, the shift register unit may include a pulse width modulation (PWM) module. As shown in FIG. 1, the pulse width modulation module may include a first input submodule 101, a first pull-down submodule 102, a second input submodule 103, a second pull-down submodule 104, a third input submodule 105 and a third pull-down submodule 106.

Specifically, the first input submodule 101 may be connected to a first control signal terminal to receive a first control signal STU, may be connected to a second control signal terminal to receive a second control signal STD, may be connected to a third control signal terminal to receive a third control signal QB_N, may be connected to a second clock signal terminal to receive a second clock signal CLKB, and may be connected to a first voltage terminal to receive a first voltage signal VGL1. The first input submodule 101 may output the first control signal STU as a first output signal Q via a first output terminal under the control of the second control signal STD and a third control signal.

The first pull-down module 102 may be connected to a first clock signal terminal to receive a first clock signal CLKA, may be connected to a first control signal terminal to receive the first control signal STU, and may be connected to a first voltage terminal to receive a first voltage signal VGL1. The first pull-down module 102 can pull down a voltage of the first output signal Q to be identical to a voltage of the first voltage signal VGL1 under the control of the first clock signal CLKA and the first control signal STU.

The second input submodule 103 may be connected to the first clock signal terminal to receive the first clock signal CLKA, and may be connected to the second clock signal terminal to receive the second clock signal CLKB. The second input submodule 103 may output the first clock signal CLKA and the second clock signal CLKB as the second output signal QB via a second output terminal.

The second pull-down submodule 104 is connected to the first output terminal to receive the first output signal Q, is connected to the second output terminal to receive the second output signal QB, and is connected to the first voltage terminal to receive the first voltage signal VGL1. The second pull-down submodule 104 can pull down a voltage of the second output signal QB to be identical to a voltage of the first voltage signal VGL1 under the control of the first output signal Q.

The third input submodule 105 may be connected to the first control signal terminal to receive the first control signal STU, may be connected to a third voltage terminal to receive a third voltage signal VGH, and may be connected to the first output terminal to receive the third output signal Q. The third input submodule 105 outputs the third voltage signal VGH to a third output terminal as a third output signal CR under the control of the first control signal STU and the first output signal Q.

The third pull-down submodule 106 may be connected to the second output terminal to receive the second output signal QB, may be connected to the first voltage terminal to receive the first voltage signal VGL1, and may be connected to the third output terminal to receive the third output signal CR. The third pull-down submodule 106 can pull down a voltage of the third output signal CR to be identical to a voltage of the first voltage signal VGL1 under the control of the second output signal QB.

In the shift register unit according to the first embodiment of the present disclosure, the first control signal is outputted to the first output terminal with delay through the first input submodule, and a voltage of the first output signal is pulled down to be identical to a voltage of the first voltage signal by the first pull-down submodule. The first clock signal or the second clock signal is outputted to the second output terminal with delay through the second input submodule, and a voltage of the signal at the second output terminal is pulled down to be identical to a voltage of the first voltage signal by the second pull-down submodule. In addition, the third voltage signal is outputted to the third output terminal with delay through the third input submodule, and a voltage of the third output signal is pulled down to be identical to a voltage of the first voltage signal by the third pull-down submodule. Thus, a delayed first control signal can be outputted at the first output terminal, the second output terminal and the third output terminal. As a result, there is an overlapped region between the pulse signals output at the first output terminal, the second output terminal and the third output terminal and the first control signal. Therefore, when a plurality of such shift register units are cascaded to form a gate driving circuit, there is an overlapped region between the pulse signals outputted from the output terminals (the first output terminal, the second output terminal or the third output terminal) of two adjacent stages of the shift register units, thus pre-charging of the pixel units can be realized to solve the problem of insufficient charging of the pixel units.

In the first embodiment, a width of pulse signals outputted from the output terminals (the first output terminal, the second output terminal or the third output terminal) of the shift register unit can be changed with a pulse width of the first control signal. Therefore, the output signal of the shift register unit can be adjusted as needed without adding more shift registers and clock signals or changing the internal structure of the shift register unit. Thus, when a plurality of shift register units are cascaded to form a gate driving circuit, the overlapped region between output signals of two adjacent stages of the shift register units can be adjusted, so as to match different pre-charging times.

In the shift register unit of the first embodiment as shown in FIG. 1, the second pull-down submodule 104 can be controlled by the first output signal Q to pull down a voltage of the second output signal QB to be identical to a voltage of the first voltage signal VGL1. Moreover, the third pull-down submodule 106 can be controlled by the second output signal QB to pull down a voltage of the third output signal CR to be identical to a voltage of the first voltage signal VGL1. Therefore, if leakage occurs at the first output terminal, output of the second output signal QB and the third output signal CR will be directly affected.

Figure 2:
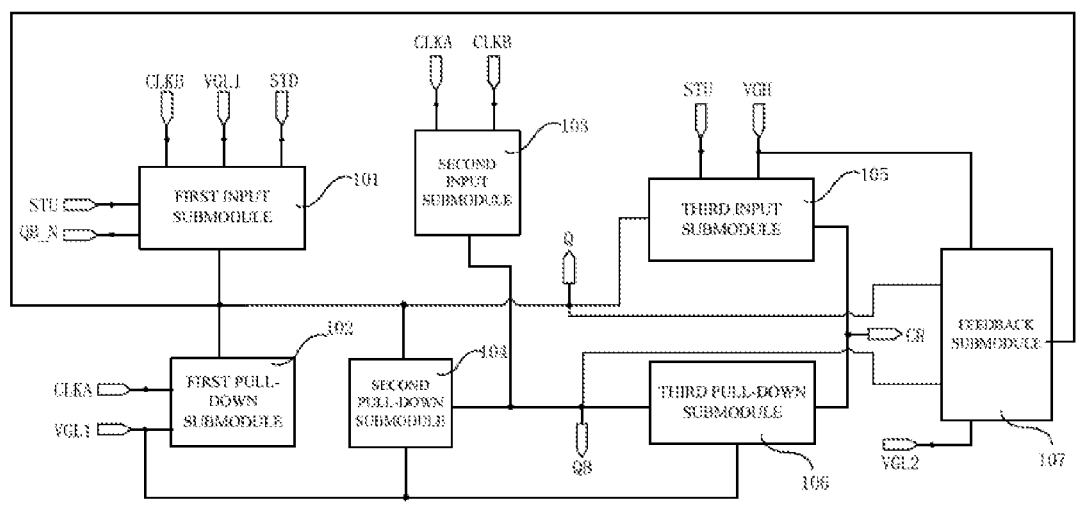
FIG. 2 is a schematic block diagram of the shift register unit according to a second embodiment of the present disclosure.

FIG. 2 shows a schematic block diagram of the shift register unit in a second embodiment of the disclosure. As shown in FIG. 2, in addition to the first input submodule 101, the first pull-down module 102, the second input submodule 103, the second pull-down submodule 104, the third input submodule 105 and the third pull-down submodule 106, the pulse width modulation module in the shift register unit may further include a feedback submodule 107.

Specifically, the feedback submodule 107 may be connected to the first output terminal to receive the first output signal Q, may be connected to the second output terminal to receive the second output signal QB, may be connected to the third voltage terminal to receive the third voltage signal VGH, and may be connected to the second voltage terminal to receive the second voltage signal VGL2. The feedback submodule 107 can output the third voltage signal VGH to the first input submodule 101 as a feedback signal while under the control of the first output signal Q to prevent leakage at the first output terminal from affecting the first control signal STU. Alternatively, the feedback submodule 107 can output the second voltage signal VGL2 to the first pull-down submodule 102 as a feedback signal under the control of the second output signal QB to prevent leakage at the first output terminal from affecting the first voltage signal VGL1. Thus, the shift register unit of the present embodiment can prevent leakage at the first output terminal Q from affecting the first control signal STU or the first voltage signal VGL1, avoid influence on voltage of the first output signal Q, and ensure that the second output signal QB and the third output signal CR can be outputted normally.

The implementation of respective submodules of the pulse width modulation module in the above embodiments will be described in detail by way of examples.

Figure 3:
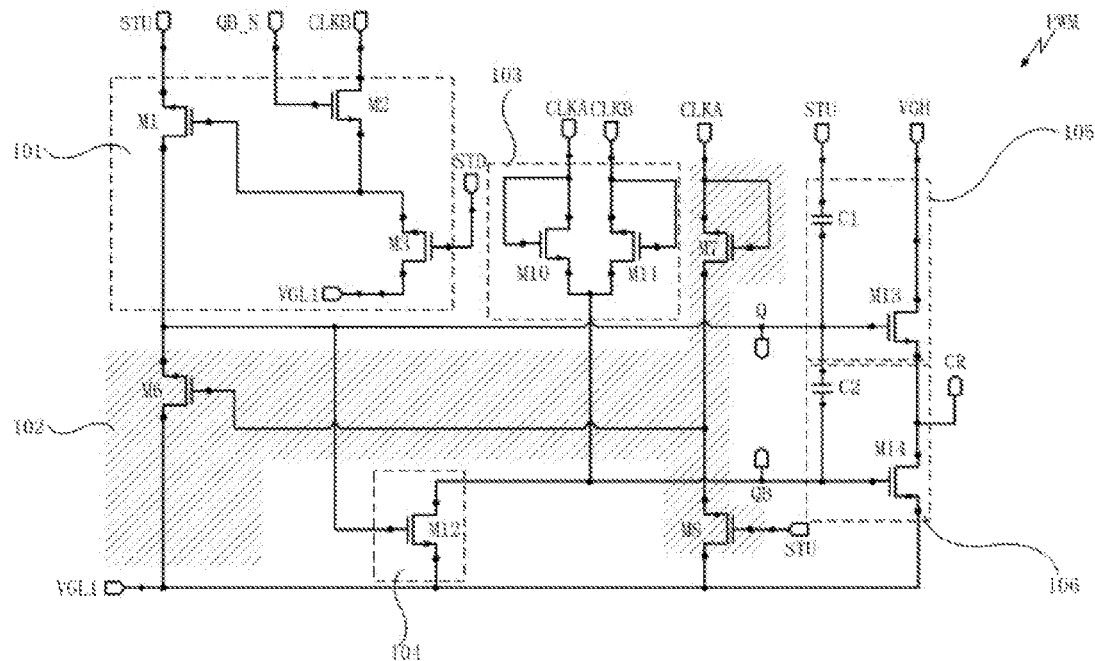
FIG. 3 is a circuit diagram of an example of the shift register unit shown in FIG. 1.

FIG. 3 shows a circuit diagram of an example of the shift register unit as shown in FIG. 1. In this example, transistors are an N-type transistor. The transistors could also be a P-type transistor.

As shown in FIG. 3, the first input submodule 101 may include a first transistor M1, a second transistor M2 and a third transistor M3. Specifically, a gate of the first transistor M1 may be connected to a second electrode (e.g. source) of the second transistor M2, and a first electrode (e.g. drain) thereof may be connected to the first output terminal, and a second electrode (e.g. source) thereof may be connected to the first control signal terminal. A gate of the second transistor M2 may be connected to the third control signal terminal, and a first electrode (e.g. drain) thereof may be connected to the second clock signal terminal. A gate of the third transistor M3 may be connected to the second control signal terminal, a second electrode (e.g. source) thereof may be connected to the second electrode of the second transistor M2, and a first electrode (e.g. drain) thereof may be connected to the first voltage terminal.

The first pull-down submodule 102 may include a sixth transistor M6, a seventh transistor M7 and an eighth transistor M8. Specifically, a gate of the sixth transistor M6 is connected to a first electrode (e.g. drain) of the seventh transistor, a first electrode (e.g. drain) thereof is connected to the first voltage terminal, and a second electrode (e.g. source) thereof is connected to the first output terminal. A gate and a second electrode (e.g. source) of the seventh transistor M7 are each connected to the first clock signal terminal, and a first electrode (e.g. drain) thereof is connected to a second electrode (e.g. source) of the eighth transistor M8. A gate of the eighth transistor M8 is connected to the first control signal terminal, and a first electrode (e.g. drain) thereof is connected to the first voltage terminal.

The second input submodule 103 may include a tenth transistor M10 and an eleventh transistor M11. Specifically, a gate and a first electrode (e.g. drain) of the tenth transistor M10 are each connected to the first clock signal terminal, and a second electrode (e.g. source) thereof is connected to the second output terminal. A gate and a second electrode (e.g. source) of the eleventh transistor M11 are each connected to the second clock signal terminal, and a first electrode (e.g. drain) thereof is connected to the second output terminal QB.

The second pull-down submodule 104 may include a twelfth transistor M12. Specifically, a gate of the twelfth transistor M12 is connected to the first output terminal Q, a first electrode (e.g. drain) thereof is connected to the second output terminal QB, and a second electrode (e.g. source) thereof is connected to the first voltage terminal.

The third input submodule 105 may include a first capacitor C1 and a thirteenth transistor M13. Specifically, a gate of the thirteenth transistor M13 is connected to the first output terminal, a first electrode (e.g. drain) thereof is connected to the third voltage terminal, and a second electrode (e.g. source) thereof is connected to the third output terminal. The first capacitor C1 is connected between the first control signal terminal and a gate of the thirteenth transistor M13.

The third pull-down submodule 106 may include a second capacitor C2 and a fourteenth transistor M14. Specifically, a gate of the fourteenth transistor M14 is connected to the second output terminal QB, a first electrode (e.g. drain) thereof is connected to the third output terminal, and a second electrode (e.g. source) thereof is connected to the first voltage terminal. The second capacitor C2 is connected between the first output terminal and a gate of the fourteenth transistor M14.

Figure 4:
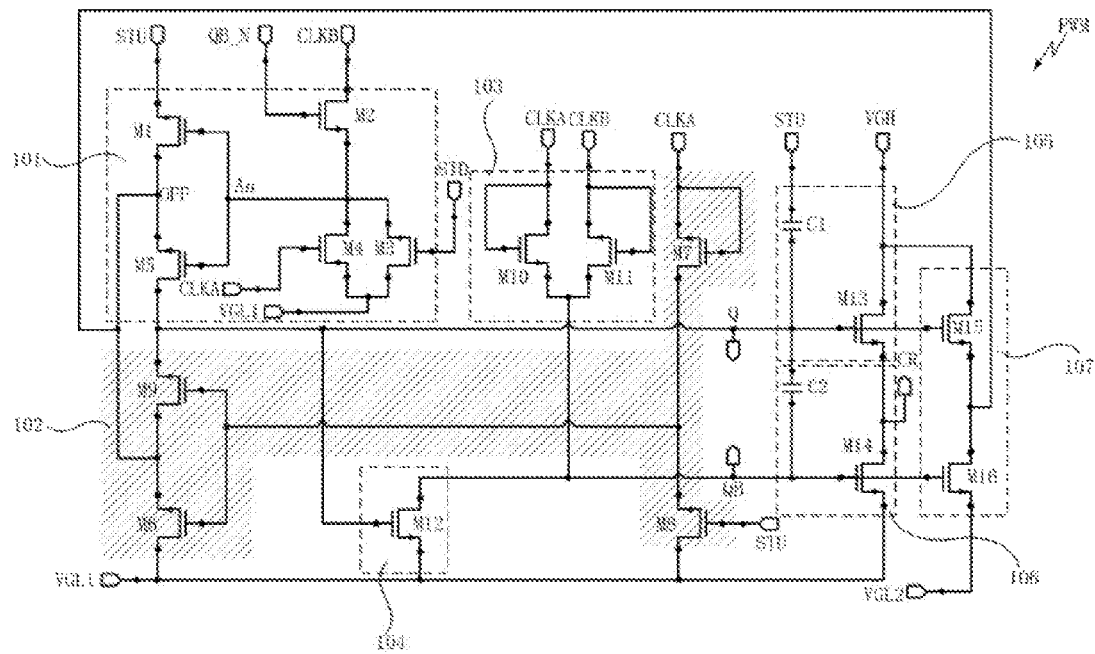
FIG. 4 is a circuit diagram of another example of the shift register unit shown in FIG. 2.

FIG. 4 shows a circuit diagram of another example of the shift register unit as shown in FIG. 2. In this example, transistors are an N-type transistor. The transistors may also include a P-type transistor.

As shown in FIG. 4, structure of the second input submodule 103, the second pull-down submodule 104, the third input submodule 105 and the third pull-down submodule 106 are the same as that in FIG. 3.

In this example, the first input submodule 101 may include a first transistor M1, a second transistor M2, a third transistor M3, a fourth transistor M4 and a fifth transistor M5. Specifically, a gate of the first transistor M1 is connected to a second electrode (e.g. source) of the second transistor M2, a first electrode (e.g. drain) thereof is connected to a second electrode (e.g. source) of the fifth transistor M5, and a second electrode (e.g. source) thereof is connected to the first control signal terminal. A gate of the second transistor M2 is connected to the third control signal terminal, a first electrode (e.g. drain) thereof is connected to the second clock signal terminal. A gate of the third transistor M3 is connected to the second control signal terminal, a first electrode (e.g. drain) thereof is connected to the first voltage terminal, and a second electrode (e.g. source) thereof is connected to a second electrode of the second transistor M2. A gate of the fourth transistor M4 is connected to the first clock signal terminal, a first electrode (e.g. drain) thereof is connected to the second electrode of the second transistor M2, and a second electrode (e.g. source) thereof is connected to the first voltage terminal. A gate of the fifth transistor M5 is connected to the second electrode of the second transistor M2, and a first electrode (e.g. drain) thereof is connected to the first output terminal.

The first pull-down submodule 102 may include a sixth transistor M6, a seventh transistor M7, an eighth transistor M8 and a ninth transistor M9. Specifically, a gate of the sixth transistor M6 is connected to a first electrode (e.g. drain) of the seventh transistor M7, a first electrode (e.g. drain) thereof is connected to the first voltage terminal, and a second electrode (e.g. source) thereof is connected to a first electrode (e.g. drain) of the ninth transistor M9. A gate and a second electrode (e.g. drain) of the seventh transistor M7 are each connected to the first clock signal terminal, and a first electrode (e.g. the drain) thereof is connected to a second electrode (e.g. source) of the eighth transistor M8. A gate of the eighth transistor M8 is connected to the first control signal terminal, and a first electrode (e.g. drain) thereof is connected to the first voltage terminal. A gate of the ninth transistor M9 is connected to the first electrode of the seventh transistor M7, and a second electrode (e.g. source) thereof is connected to the first output terminal.

The feedback submodule 107 may include a fifteenth transistor M15 and a sixteenth transistor M16. Specifically, a gate of the fifteenth transistor M15 is connected to the first output terminal, a first electrode (e.g. drain) thereof is connected to the third voltage terminal, and a second electrode (e.g. source) thereof is connected to the first input submodule 101 and the first pull-down submodule 102. In the example shown in FIG. 4, the second electrode of the fifteenth transistor M15 is connected to the first electrode of the first transistor M1 and the second electrode of the sixth transistor M6. A gate of the sixteenth transistor M16 is connected to the second output terminal, a first electrode (e.g. drain) thereof is connected to the first input submodule 101 and the first pull-down submodule 102, and a second electrode (e.g. source) thereof is connected to the second voltage terminal. In the example shown in FIG. 4, the first electrode of the sixteenth transistor M16 is connected to the first electrode of the first transistor M1 and the second electrode of the sixth transistor M6.

Figure 5:
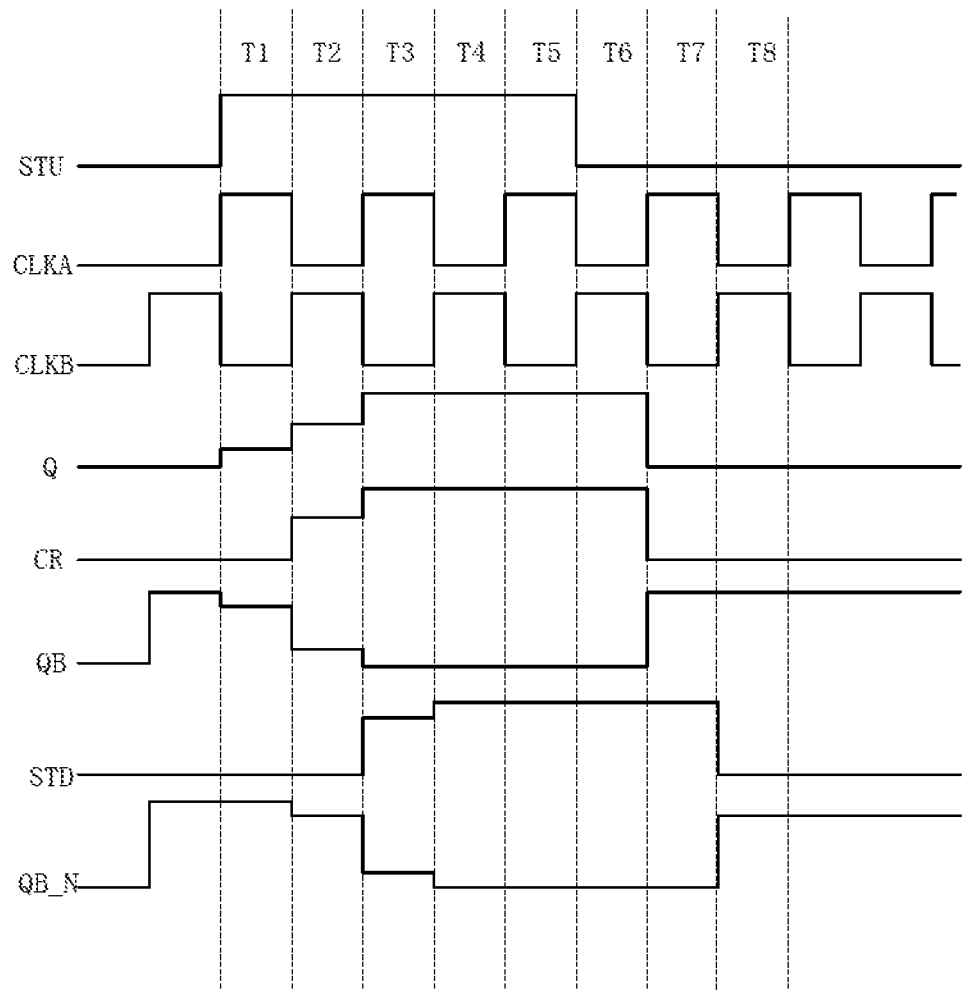
FIG. 5 is a timing chart of the respective signals of the shift register unit shown in FIG. 1 or FIG. 2.

A specific operation process of the pulse width modulation module in the shift register unit will be described in detail with reference to FIG. 4 and FIG. 5. The pulse width modulation module shown in FIG. 3 is similar to the pulse width modulation module shown in FIG. 4.

Embodiments of the present disclosure are not limited by the type of respective transistors. The transistors may be an N-type transistor or a P-type transistor. In the following, description of the embodiments will be made by using transistors that are N-type transistor by way of example. In this case, the first voltage signal VGL1 and the second voltage signal VGL2 are low level signals, and the third voltage signal VGH is a high level signal.

In another embodiment of the present disclosure, an operation cycle of the pulse width modulation module may include seven stages.

In the first stage T1, the first control signal STU=1, the first clock signal CLKA=1, the second clock signal CLKB=0, the second control signal STD=0, the third control signal QB_N=1, wherein "0" represents low level, and "1" represents high level.

In this stage, the second transistor M2 is turned on, and a voltage at node An is in low level. In addition, the fourth transistor M4 is turned on, and the first voltage signal VGL1 is outputted to the node An. In this case, the first transistor M1 and the fifth transistor M5 are both turned off. Because the second control signal STD is a low level signal, the third transistor M3 is turned off.

Because the fifth transistor M5 is turned off, no signal is outputted to the first output terminal Q. In addition, the seventh transistor M7 is turned on, and the first clock signal CLKA is outputted to gates of the ninth transistor M9 and the sixth transistor M6. Because the eighth transistor M8 is also turned on, the voltage at gates of the ninth transistor M9 and the sixth transistor M6 is pulled down to the same low level as the first voltage signal VGL1. Thus, the ninth transistor M9 and the sixth transistor M6 are turned off. Therefore no signal is outputted from the first output terminal in this first stage.

Moreover, since the tenth transistor M10 is turned on, the second output signal QB is at high level. In this case, the fourteenth transistor M14 is turned on, so that the third output signal CR is at low level. The sixteenth transistor M16 is turned on, to feed back the second voltage signal VGL2 to the first electrode of the first transistor M1 (i.e. node OFF) and the second electrode of the sixth transistor M6. Therefore, the voltage at the node OFF can prevent leakage at the first output terminal from affecting the first control signal STU or the first voltage signal VGL1. As a result, it is possible to avoid influence on the voltage of the first output signal Q and ensure that signals at the second output terminal and the third output terminal to be outputted normally.

In the second stage T2, STU=1, CLKA=0, CLKB=1, STD=0, and QB_N=1. The second transistor M2 is turned on, and the voltage at node An becomes high level, and the third transistor M3 and the fourth transistor are both in turned off state. In this case, the first transistor M1 and the fifth transistor M5 are both in turned on state, so that the first control signal STU is outputted to the first output terminal. In addition, the ninth transistor M9 and the sixth transistor M6 are both turned off.

Under the control of the first output signal Q, the thirteenth transistor M13 is turned on to output the third voltage signal VGH to the third output terminal. In addition, the fifth transistor M15 is turned on, to feed back the third voltage signal VGH to the node OFF.

Moreover, under the control of the first output signal Q, the twelfth transistor M12 is turned on to pull down the voltage of the second output signal QB to the same low level as the first voltage signal VGL1.

In the third stage T3, STU=1, CLKA=1, CLKB=0, STD=1, and QB_N=0. The third transistor M3 and the fourth transistor M4 are turned on, and the voltage at node An becomes low level again, and the first transistor M1 and the fifth transistor M5 are turned off. Under bootstrap effect of the first capacitor C1, the voltage of the first output signal Q is further raised, so that the thirteenth transistor M13 and the fifteenth transistor M15 are more sufficiently turned on.

Similar to the second stage and under the control of the first output signal Q, the first voltage signal is outputted to the second output terminal, and the third voltage signal VGH is outputted to the third output terminal through the thirteenth transistor M13.

In the fourth stage T4, STU=1, CLKA=0, CLKB=1, STD=1, and QB_N=0. Specifically, the second transistor M2 is turned off, the third transistor M3 is turned on, and the voltage at node An is at low level. The first transistor M1 and the fifth transistor M5 are both in turned off state. The eighth transistor M8 is turned on, so that the first voltage signal VGL1 is outputted to gates of the ninth transistor M9 and the sixth transistor M6, and the ninth transistor M9 and the sixth transistor M6 are in turned off state. In this case, the first output signal Q is kept at the high level of the previous stage.

Under the control of the first output signal Q, the thirteenth transistor M13 is turned on, and the third voltage signal VGH is outputted to the third output terminal. In addition, the fifth transistor M15 is turned on, and the third voltage signal VGH is fed back to the node OFF.

Under the control of the first output signal Q, the twelfth transistor M12 is turned on to pull down the voltage of the second output signal QB to the same low level as the first voltage signal VGL1.

In the fifth stage T5, STU=1, CLKA=1, CLKB=0, STD=1, and QB_N=0. Since respective signals in this stage are the same as that in the third stage T3, the output result at respective output terminals are the same as in the third stage T3.

In the sixth stage T6, STU=0, CLKA=0, CLKB=1, STD=1, and QB_N=0. The third transistor M3 is turned on, the voltage at node An becomes the voltage of the first voltage signal VGL1, and the first transistor M1 and the fifth transistor M5 are both in turned off state. Since the seventh transistor M7 and the eighth transistor M8 are both turned off, the ninth transistor M9 and the sixth transistor M6 are also in turned off state. Therefore, the first output signal Q is still kept at high level of the previous stage.

Moreover, as described above, under the control of the first output signal Q, the first voltage signal VGL1 is outputted to the second output terminal, and the third voltage signal VGH is outputted to the third output terminal through the thirteenth transistor M13.

In the seventh stage T7, STU=0, CLKA=1, CLKB=0, STD=1, and QB_N=0. The third transistor M3 and the fourth transistor M4 are both turned on, the voltage at node An is in low level of the first voltage signal VGL1, and the first transistor M1 and the fifth transistor M5 are both in turned off state. The seventh transistor M7 is turned on, the first clock signal CLKA is outputted to gates of the ninth transistor M9 and the sixth transistor M6, the ninth transistor M9 and the sixth transistor M6 are both turned on, in order to pull down the voltage of the first output signal Q to the same low level as the first voltage signal VGL1.

In addition, the tenth transistor M10 is turned on, and the first clock signal CLKA is outputted to the second output terminal.

Under the control of the second output signal QB, the fourteenth transistor M14 and the sixteenth transistor M16 are turned on. The fourteenth transistor M14 pulls down the voltage of the third output signal CR to the same low level as the first voltage signal VGL1. The sixteenth transistor M16 feeds back the second voltage signal VGL2 to the node OFF.

In the eighth stage T8, STU=0, CLKA=0, CLKB=1, STD=0, and QB_N=1. The second transistor M2 is turned on, and the voltage at node An becomes high level, thus the first transistor M1 and the fifth transistor M5 are turned on. The first control signal STU is outputted to the first output terminal, so that noise of the first output terminal Q is released through the first control signal terminal STU. The ninth transistor M9 and the sixth transistor M6 are in turned off state. The eleventh transistor M11 is turned on, and the second clock signal CLKB is outputted to the second output terminal.

Under the control of the second output signal QB, the fourteenth transistor M14 and the sixteenth transistor M16 are turned on. The fourteenth transistor M14 pulls down the voltage of the third output signal CR to the same low level as the first voltage signal VGL1. The sixteenth transistor M16 feeds back the second voltage signal VGL2 to the node OFF.

Figure 6:
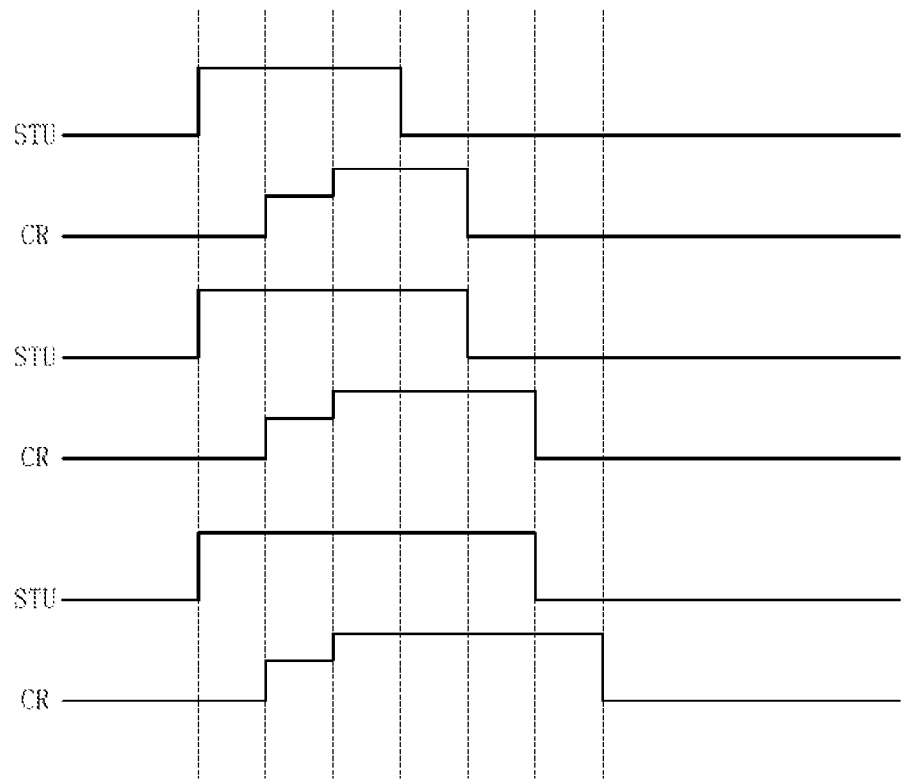
FIG. 6 is a schematic diagram illustrating that the pulse width of the third output signal changes with the pulse width of the first control signal.

From the above description, it can be seen that the first control signal STU is at high level from the first stage T1 to the fifth stage T5, the first output signal Q and the third output signal CR are at high level from the second stage T2 to the sixth stage T6, and the second output signal QB is at low level from the second stage T2 to the sixth stage T6 (i.e. is a reverse signal of the first output signal Q and the third output signal CR). Therefore, the pulse width of the first output signal Q, the second output signal QB and the third output signal CR are the same as the pulse width of the first control signal STU. Thus, by adjusting the pulse width of the first control signal STU, the pulse width of respective output signals (the first output signal Q, the second output signal QB and the third output signal CR) of the shift register unit can be adjusted. FIG. 6 shows a schematic diagram illustrating that the pulse width of the third output signal CR changes with the pulse width of the first control signal.

Since the pulse width of respective output signals (the first output signal Q, the second output signal QB and the third output signal CR) can be changed with the pulse width of the first control signal STU, the pulse width of the first output signal Q, the second output signal QB and the third output signal CR can be adjusted without adding other shift registers and clock signals and without changing structure of the shift register. Thus, when the shift register units are cascaded to form a gate driving circuit, the overlapped region between respective output signals (the first output signal Q, the second output signal QB and the third output signal CR) from two adjacent stage of the shift register units can be adjusted so as to match different pre-charging time.

In addition, with respect to OLED display technology, a requirement on stability and uniformity of parameters of thin film transistors in the OLED pixel circuit is relatively high. Therefore, a compensation circuit needs to be provided in the OLED pixel circuit to compensate threshold voltage of the thin film transistors. Generally, an operation process of the OLED pixel circuit having a threshold voltage compensation function includes a reset stage, a data write-in stage, a threshold voltage compensation stage, and a light emitting stage, etc. Therefore, the number of required control signals is large, and the control signals need to be adjustable within a certain range. However, in a prior art OLED pixel circuit, a plurality of shift registers is needed to cooperate with each other, the shift registers have a complex structure, and the area of layout design is relatively large. In an OLED pixel circuit having a threshold voltage compensation function, the shift register unit can be employed so as to generate the control signals required in each of the stages for the OLED pixel circuit.

Figure 7A:
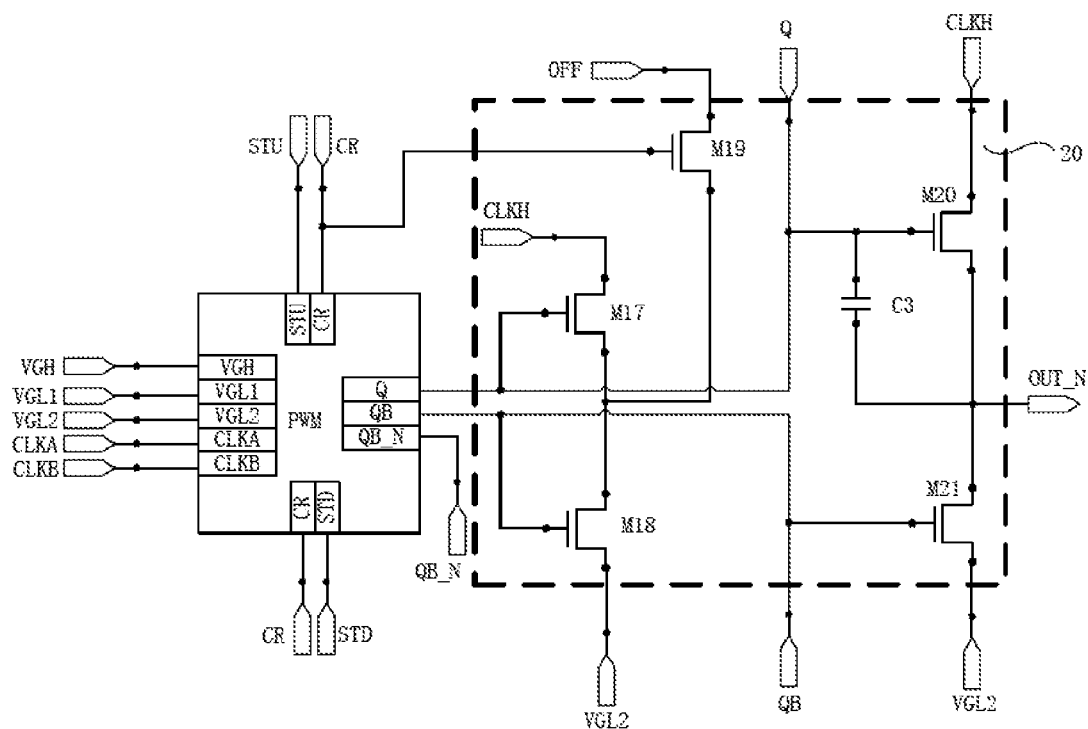
FIG. 7A is a schematic circuit diagram of the shift register unit according to a third embodiment of the present disclosure.

FIG. 7A shows a schematic circuit diagram of the shift register unit according to a third embodiment of the present disclosure. As described above, it is required for the OLED pixel circuit to include compensation function to provide a multi-pulse signal whose pulse width and number can be adjusted to reset the OLED pixel circuit. However, a single shift register cannot generate such a signal, and thus a plurality of shift registers is needed to cooperate with each other. The shift register according to the present embodiment can generate a multi-pulse signal whose pulse width can be adjusted.

As shown in FIG. 7A, the shift register unit includes a pulse width modulation module PWM and a multi-pulse output module 20, wherein structure of the pulse width modulation module PWM may be as shown in any one of FIG. 1 through FIG. 4.

The multi-pulse output modules 20 may be connected to the pulse width modulation module PWM to receive the first output signal Q, the second output signal QB and the third output signal CR. In addition, the multi-pulse output module 20 may further be connected to the third clock signal terminal to receive the third clock signal CLKH, and may be connected to the second voltage terminal to receive the second voltage signal VGL2. The multi-pulse output module 20 may output a multi-pulse signal via driving signal output terminal OUT_N under the control of the first output signal Q, the second output signal QB and the third output signal CR outputted by the pulse width modulation module PWM.

As shown in FIG. 7A, the multi-pulse output module 20 may include a seventeenth transistor M17, an eighteenth transistor M18, a nineteenth transistor M19, a twentieth transistor M20, a twenty-first transistor M21 and a third capacitor C3.

Specifically, a gate of the seventeenth transistor M17 is connected to the first output terminal, a first electrode thereof is connected to the third clock signal terminal, and a second electrode thereof is connected to a second electrode of the eighteenth transistor M18. A gate of the eighteenth transistor M18 is connected to the second output terminal, and a first electrode thereof is connected to the second voltage terminal. A gate of the nineteenth transistor M19 is connected to the third output terminal, a first electrode thereof is connected to the first input submodule (in the example in FIG. 3 or FIG. 4, the first electrode of the first transistor), and a second electrode thereof is connected to the second electrode of the seventeenth transistor M17 and the second electrode of the eighteenth transistor M18. If the pulse width modulation module PWM includes a feedback submodule, then the first electrode of the nineteenth transistor M19 is connected to a feedback signal terminal OFF (see FIG. 4) for outputting a feedback signal. A gate of the twentieth transistor M20 is connected to the first output terminal, a first electrode thereof is connected to the third clock signal terminal, and a second electrode thereof is connected to a driving signal output terminal OUT_N. A gate of the twenty-first transistor M21 is connected to the second output terminal, a first electrode thereof is connected to the second voltage terminal, and a second electrode thereof is connected to the driving signal output terminal OUT_N. The third capacitor C3 is connected between the gate of the twentieth transistor and the driving signal output terminal OUT_N.

The embodiments of the present disclosure are not limited in any way by the first electrode and the second electrode of the transistors.

Figure 7B:
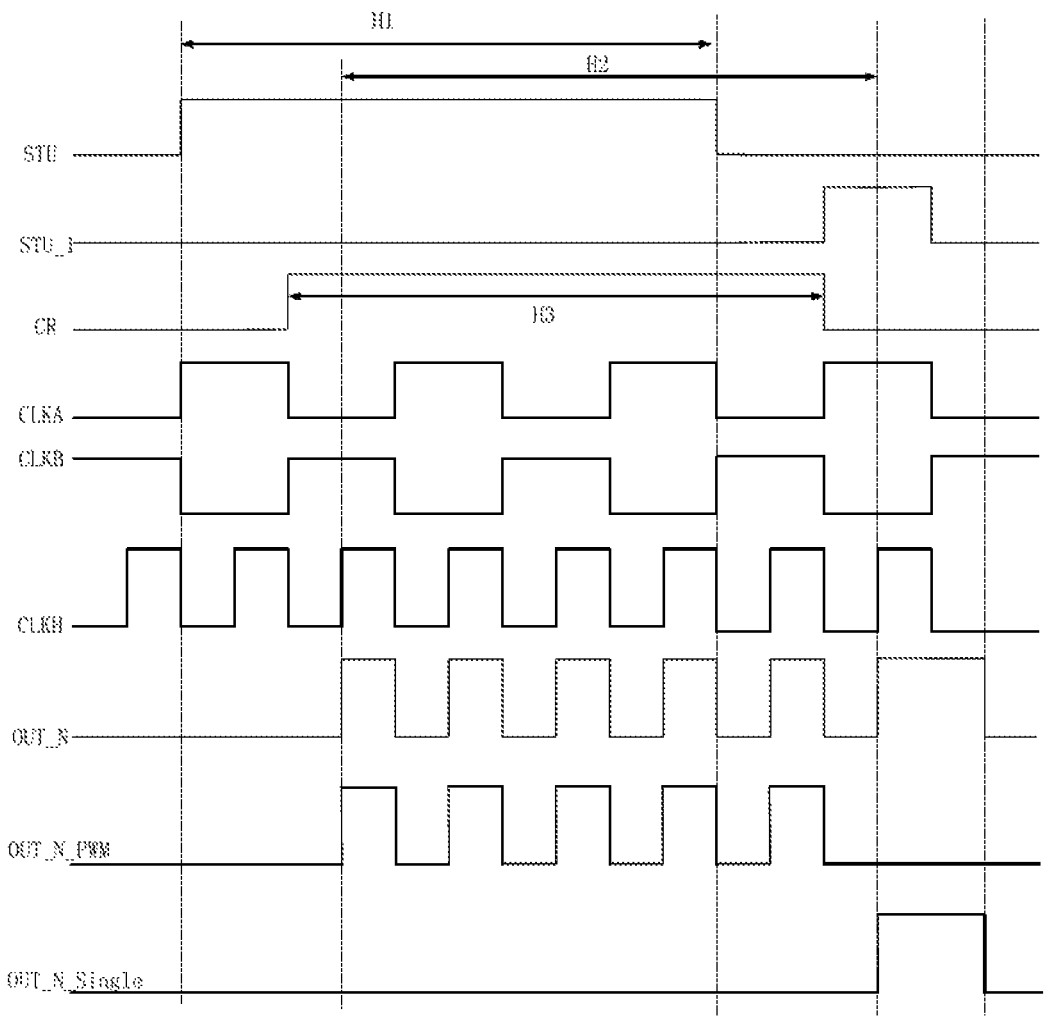
FIG. 7B is a timing chart of the respective signals of the shift register unit shown in FIG. 7A.

FIG. 7B shows a timing chart of the respective signals of the shift register unit shown in FIG. 7A. It can be seen that, the width H2 of the multi-pulse signal outputted at the driving signal output terminal OUT_N matches the pulse width H3 of the output signal (e.g. the third output signal CR) outputted by the pulse width modulation module PWM. Since the pulse width H3 of the third output signal matches the width H1 of the first control signal STU, by adjusting the width H1 of the first control signal STU, the width H2 of the multi-pulse signal outputted by the driving signal output terminal OUT_N can be adjusted.

In addition, a frequency of the multi-pulse signal matches a frequency of the third clock signal CLKH. In embodiments of the present disclosure, the term "match", as used herein, is defined as being equal or different by a predetermined value which may be set as needed. Thus, by adjusting the frequency of the third clock signal CLKH, the number of pulses of the multi-pulse signal outputted at the driving signal output terminal OUT_N can be adjusted.

Therefore, in the shift register unit as shown in FIG. 7A, it is possible to adjust the width and number of the multi-pulse signal outputted at the driving signal output terminal OUT_N. Thus, for a OLED pixel circuit having different reset time or requirement, the shift register unit according to the present embodiment can provide corresponding control signals.

Figure 7C:
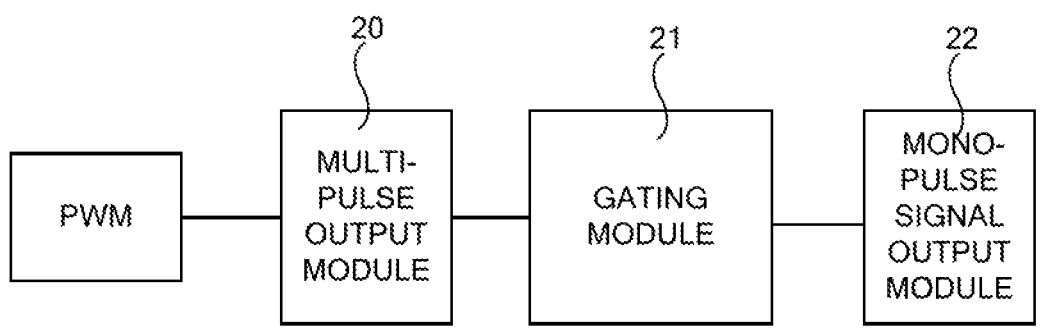
FIG. 7C is a schematic block diagram of the shift register unit according to a fourth embodiment of the present disclosure.

In addition, after the OLED pixel circuit is reset by the multi-pulse signal, in the data write-in stage, a data signal Vdata provided by a data line also needs to be written into the OLED pixel circuit. For this end, FIG. 7C shows a schematic block diagram of the shift register unit according to a fourth embodiment of the present disclosure.

In this embodiment, in addition to the structure of the shift register unit shown in FIG. 7A, the shift register unit further includes a gating module 21 and a mono-pulse signal output module 22. Specifically, one end of the gating module 21 is connected to the multi-pulse output module 20, and another end is connected to the mono-pulse signal output module 22. The gating module 21 can gate a mono-pulse signal outputted by the mono-pulse signal output module 22 after gating the multi-pulse signal outputted by the multi-pulse output module 20 so as to concatenate the multi-pulse signal with the mono-pulse signal. Thus, it is possible to physically achieve short circuiting between the output terminal of the multi-pulse output module 20 and the output terminal of the mono-pulse signal output module 22. It is noted that, as shown in FIG. 7B, the multi-pulse output module 20 can output a multi-pulse signal OUT_N_PWM when it is operated alone, the mono-pulse signal output module 22 can output a mono-pulse signal OUT_N_Single when it is operated alone, wherein STU a represents a start signal of the mono-pulse signal output module 22. In the shift register unit as shown in FIG. 7C, the multi-pulse signal OUT_N_PWM is overlapped with the mono-pulse signal OUT_N_Single and is output through the driving signal output terminal OUT_N.

Figure 7D:
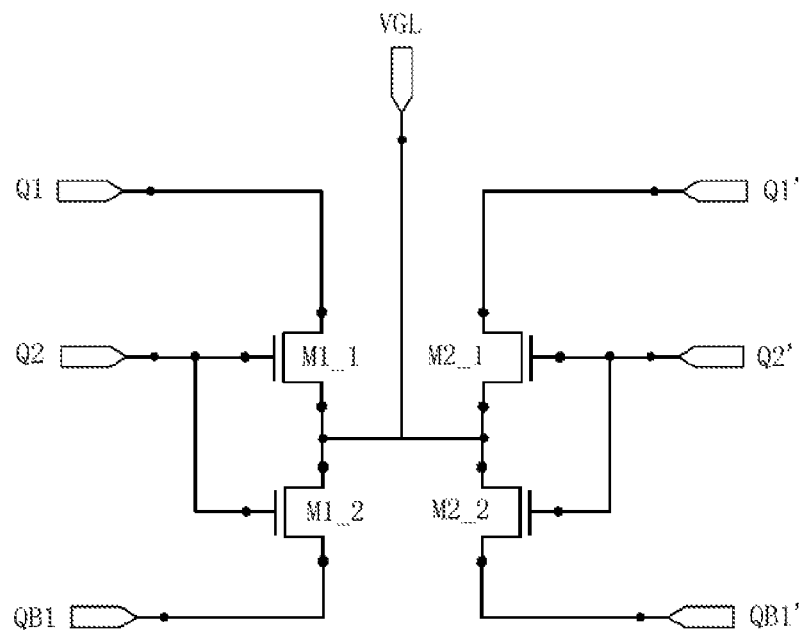
FIG. 7D is a schematic diagram of an example of the gating module in FIG. 7C.

In this embodiment, after the OLED pixel circuit is reset by the multi-pulse signal outputted by the multi-pulse output module 20, the mono-pulse signal OUT_N_Single with relative wide pulse width outputted by the mono-pulse signal output module 22 is used to write the data signal Vdata provided by the data line into the OLED pixel circuit. FIG. 7D shows an example of the gating module 21. In this example, the gating module 21 has a symmetrical structure. Ports Q1, Q2 and QB1 connected to a transistor M1_1 and a transistor M1_2 are connected to the multi-pulse output module 20, and ports Q1', Q2' and QB1' connected to a transistor M2_1 and a transistor M2_2 are connected to the mono-pulse signal output module 22. A low level signal is inputted at the voltage terminal VGL.

Figure 8A:
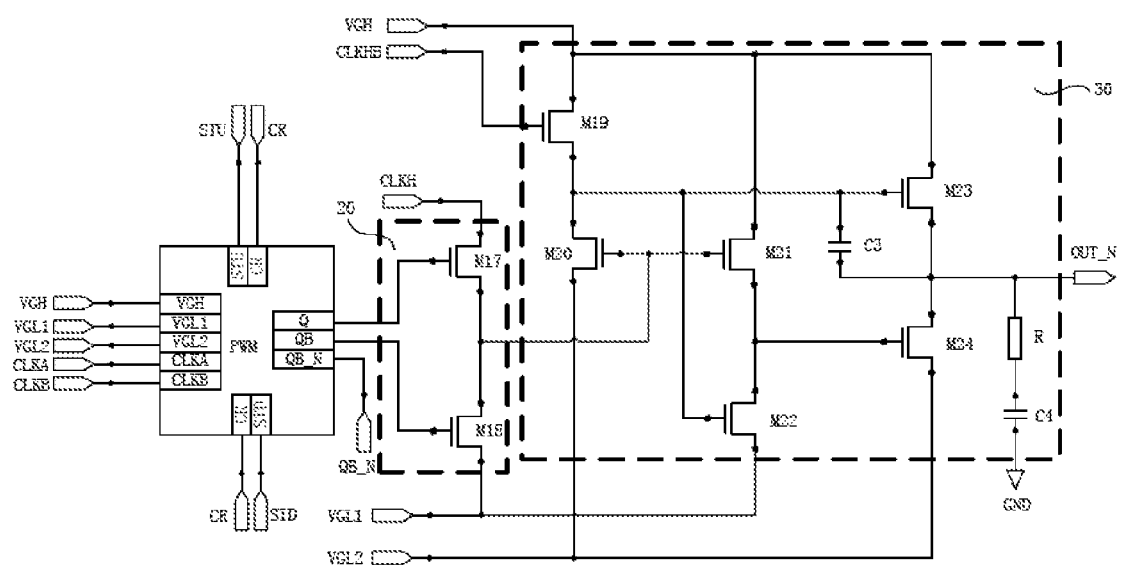
FIG. 8A is a schematic circuit diagram of the shift register unit according to a fifth embodiment of the present disclosure.

FIG. 8A shows a schematic circuit diagram of the shift register unit according to a fifth embodiment. The shift register unit of the fifth embodiment can generate a reversed multi-pulse signal with adjustable pulse width. As described above, in the light emitting stage of the OLED pixel circuit, a reversed multi-pulse signal needs to be provided so that a control switch TFT in the OLED pixel circuit connected to a voltage source VDD is turned on, and thus a signal from the voltage source VDD is inputted to a driving transistor in the OLED pixel circuit, and a driving current is generated to drive the OLED to emit light.

As shown in FIG. 8A, the shift register unit includes a pulse width modulation module PWM, a multi-pulse output module 20 and a high frequency reverse module 30, wherein, the structure of the pulse width modulation module PWM may be as shown in any one of FIG. 1 to FIG. 4.

In the fifth embodiment, the multi-pulse output module 20 is connected to the pulse width modulation module PWM to receive the first output signal Q and the second output signal QB. The multi-pulse output module 20 is also connected to the third clock signal terminal to receive the third clock signal CLKH, and is connected to the first voltage terminal to receive the first voltage signal VGL1. The multi-pulse output module 20 outputs a multi-pulse signal under the control of the first output signal Q and the second output signal QB outputted by the pulse width modulation module PWM and whose pulse width may be modulated.

The high frequency reverse module 30 may be connected to the multi-pulse output module 20, is connected to the third voltage terminal to receive the third voltage signal VGH, is connected to a fourth clock signal terminal to receive a fourth clock signal CLKHB, is connected to the first voltage terminal to receive the first voltage signal VGL1, and is connected to the second voltage terminal to receive the second voltage signal VGL2. The high frequency reverse module 30 may reverse the multi-pulse signal outputted by the multi-pulse output module 20 under the control of the fourth clock signal CLKHB, and output the reversed multi-pulse signal at the driving signal output terminal OUT_N. The fourth clock signal CLKHB is reverse to the third clock signal CLKH.

In FIG. 8A, the multi-pulse output module 20 may include a seventeenth transistor M17 and an eighteenth transistor M18. Specifically, a gate of the seventeenth transistor M17 is connected to the first output terminal, a first electrode thereof is connected to the third clock signal terminal, and a second electrode thereof is connected to the high frequency reverse module 30. A gate of the eighteenth transistor M18 is connected to the second output terminal, a first electrode thereof is connected to the first voltage terminal, and a second electrode thereof is connected to the high frequency reverse module 30.

The high frequency reverse module 30 may include a nineteenth transistor M19, a twentieth transistor M20, a twenty-first transistor M21, a twenty-second transistor M22, a twenty-third transistor M23, a twenty-fourth transistor M24, a third capacitor C3, a fourth capacitor C4 and a resistor R. Specifically, a gate of the nineteenth transistor M19 is connected to the fourth clock signal terminal, a first electrode thereof is connected to the third voltage terminal, and a second electrode thereof is connected to a first electrode of the twentieth transistor M20. The fourth clock signal and the third clock signal have same frequency but with reversed direction. A gate of the twentieth transistor M20 is connected to a gate of the twenty-first transistor M21 and the multi-pulse output module 20 (that is, the second electrode of the seventeenth transistor M17 and the second electrode of the eighteenth transistor M18), and a second electrode thereof is connected to the second voltage terminal. A first electrode of the twenty-first transistor M21 is connected to the third voltage terminal VGH, and a second electrode thereof is connected to a gate of the twenty-fourth transistor M24. A gate of the twenty-second transistor M22 is connected to the second electrode of the nineteenth transistor M19, a first electrode thereof is connected to the gate of the twenty-fourth transistor M24, and a second electrode thereof is connected to the first voltage terminal. A gate of the twenty-third transistor M23 is connected to the second electrode of the nineteenth transistor M19, a first electrode thereof is connected to the third voltage terminal, and a second electrode thereof is connected to the driving signal output terminal OUT_N. A first electrode of the twenty-fourth transistor M24 is connected to the driving signal output terminal OUT_N, and a second electrode thereof is connected to the second voltage terminal. The third capacitor C3 is connected between the gate of the twenty-third transistor M23 and the second electrode of the twenty-third transistor M23. The resistor R and the fourth capacitor C4, after being connected in series, are connected between the driving signal output terminal OUT_N and a ground terminal GND.

Therefore, in the shift register unit of the fifth embodiment, the pulse width modulation module PWM outputs the mono-pulse signals (i.e. the first output signal Q and the second output signal QB) whose pulse width are adjustable at the first output terminal and the second output terminal, then, the mono-pulse signals are passed through the multi-pulse output module 20 to generate the multi-pulse signal whose pulse width and number are adjustable, and finally, the multi-pulse signal is reversed by the high frequency reverse module 30 and is outputted from the driving signal output terminal OUT_N. Thus, the shift register unit of the present embodiment can generate a reversed multi-pulse signal whose pulse width and number of pulses can be adjusted, so as to be able to provide corresponding control signals to OLED pixel circuits having different light emitting time or requirement.

Figure 8B:
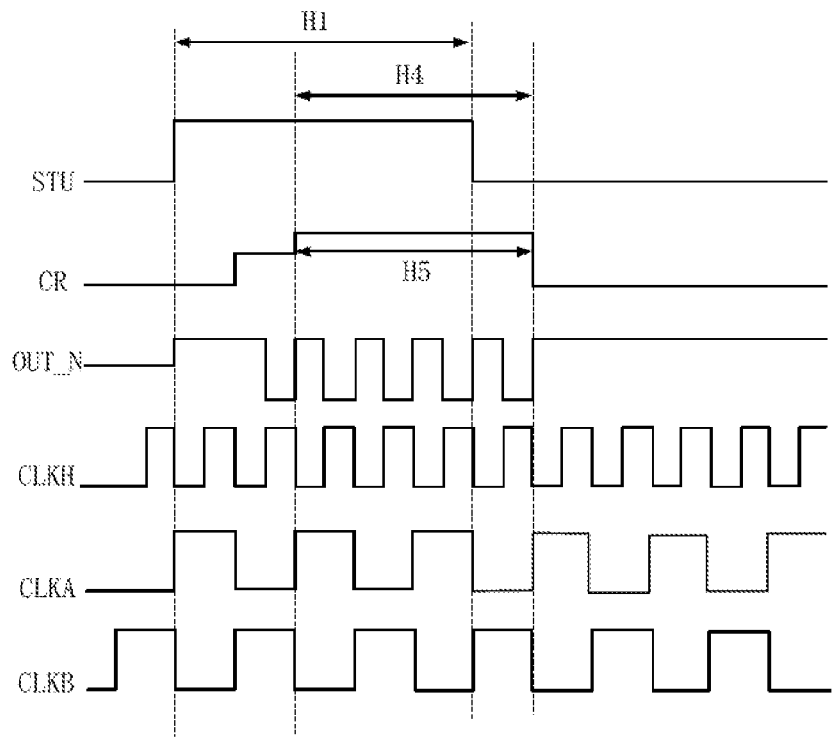
FIG. 8B is a timing chart of the respective signals of the shift register unit shown in FIG. 8A.

As shown in FIG. 8B, the width H4 of the reversed multi-pulse signal matches the width H5 of the output signal (e.g. the third output signal CR) of the pulse width modulation module PWM. As described above, by adjusting the pulse width H1 of the first control signal STU, it is possible to adjust the pulse width of the output signal of the pulse width modulation module PWM. Therefore, by adjusting the pulse width H1 of the first control signal, it is possible to adjust the width H4 of the reversed multi-pulse signal.

In addition, a frequency of the reversed multi-pulse signal matches a frequency of the third clock signal CLKH. Thus, by adjusting the frequency of the third clock signal CLKH, it is possible to adjust the number of pulses of the reversed multi-pulse signal.

According to the timing chart of signals shown in FIG. 8B, state of respective transistors in the multi-pulse output module 20 and the high frequency reverse module 20 can be derived, and further waveform diagram of the reversed multi-pulse signal output at the driving signal output terminal OUT_N can be derived.

Figure 9A:
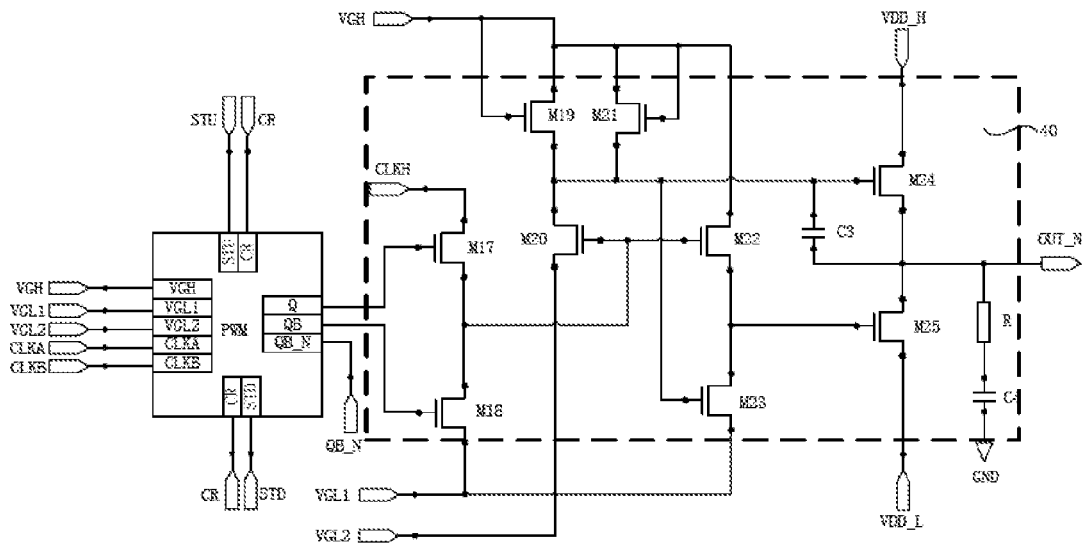
FIG. 9A is a schematic circuit diagram of the shift register unit according to a sixth embodiment of the present disclosure.

FIG. 9A shows a schematic circuit diagram of the shift register unit according to a sixth embodiment. As described above, in the light emitting stage of an OLED pixel circuit, a width of a negative pulse of the voltage signal of the voltage source VDD needs to be adjusted, so as to meet requirement on light emitting brightness of the OLED pixel circuit. The shift register unit of the sixth embodiment can generate a reversed mono-pulse signal whose pulse width is adjustable.

As shown in FIG. 9A, the shift register unit includes a pulse width modulation module PWM and a reverse module 40, wherein structure of the pulse width modulation module PWM may be as shown in any one of FIG. 1 to FIG. 4.

The reverse module 40 may be connected to the pulse width modulation module PWM to receive the first output signal Q and the second output signal QB. The reverse module 40 may be further connected to the third clock signal terminal to receive the third clock signal CLKH, connected to the first voltage terminal to received the first voltage signal VGL1, connected to the second voltage terminal to receive the second voltage signal VGL2, connected to the third voltage terminal to received the third voltage signal VGH, connected to a fourth voltage terminal to received a fourth voltage signal VDD_L, and connected to a fifth voltage terminal to receive a fifth voltage signal VDD_H. The reverse module 40 can output a reversed mono-pulse signal at the driving signal output terminal OUT_N under the control of the third voltage signal VGH, the first output signal Q and the second output signal QB outputted by the pulse width modulation module PWM. In the present embodiment, the fourth voltage signal VDD_L and the fifth voltage signal VDD_H are direct current voltage with different amplitude.

Specifically, the reverse module 40 may include a seventeenth transistor M17, an eighteenth transistor M18, a nineteenth transistor M19, a twentieth transistor M20, a twenty-first transistor M21, a twenty-second transistor M22, a twenty-third transistor M23, a twenty-fourth transistor M24, a twenty-fifth transistor M25, a third capacitor C3, a fourth capacitor C4 and a resistor R.

A gate of the seventeenth transistor M17 is connected to the first output terminal, a first electrode thereof is connected to the third clock signal terminal, and a second electrode thereof is connected to a second electrode of the eighteenth transistor M18. A gate of the eighteenth transistor M18 is connected to the second output terminal, and a first electrode thereof is connected to the first voltage terminal. A gate and a first electrode of the nineteenth transistor M19 are connected to the third voltage terminal, and a second electrode thereof is connected to a first electrode of the twentieth transistor M20. A gate of the twentieth transistor M20 is connected to the second electrode of the seventeenth transistor M17 and the second electrode of the eighteenth transistor M18, and a second electrode thereof is connected to the second voltage terminal VGL2. A gate and a first electrode of the twenty-first transistor M21 are each connected to the third voltage terminal, and a second electrode thereof is connected to the second electrode of the nineteenth transistor M19 and the first electrode of the twentieth transistor M20. A gate of the twenty-second transistor M22 is connected to a gate of the twentieth transistor M20, a first electrode thereof is connected to the third voltage terminal, and a second electrode thereof is connected to a first electrode of the twenty-third transistor M23. A gate of the twenty-third transistor M23 is connected to the second electrode of the nineteenth transistor M19 and the first electrode of the twentieth transistor M20, a first electrode thereof is connected to the second electrode of the twenty-second transistor M22, and a second electrode thereof is connected to the first voltage terminal. A gate of the twenty-fourth transistor M24 is connected to the second electrode of the nineteenth transistor M19 and the first electrode of the twentieth transistor M20, a first electrode thereof is connected to the fifth voltage terminal VDD_H, and a second electrode thereof is connected to the driving signal output terminal OUT_N. A gate of the twenty-fifth transistor M25 is connected to the second electrode of the twenty-second transistor M22 and the first electrode of the twenty-third transistor M23, a first electrode thereof is connected to the fourth voltage terminal VDD_L, and a second electrode thereof is connected to the driving signal output terminal OUT_N. The third capacitor C3 is connected between a gate of the twenty-fourth transistor M24 and the second electrode of the twenty-fourth transistor M24. The resistor R and the fourth capacitor C4, after being connected in series, are connected between the driving signal output terminal OUT_N and a ground terminal GND.

In the shift register unit of the sixth embodiment, the pulse width modulation module PWM outputs mono-pulse signals (i.e. the first output signal Q and the second output signal QB) whose pulse width are adjustable at the first output terminal and the second output terminal, then, the mono-pulse signals are reversed by the reverse module 40, and a reversed mono-pulse signal whose pulse width is adjustable is outputted at the driving signal output terminal OUT_N. Thus, with the shift register unit of the present embodiment, in the light emitting stage of the OLED pixel circuit, it is possible to adjust the width of the negative pulse of the voltage signal of the voltage source VDD, thus meeting requirement on light emitting brightness of the OLED pixel circuit.

Figure 9B:
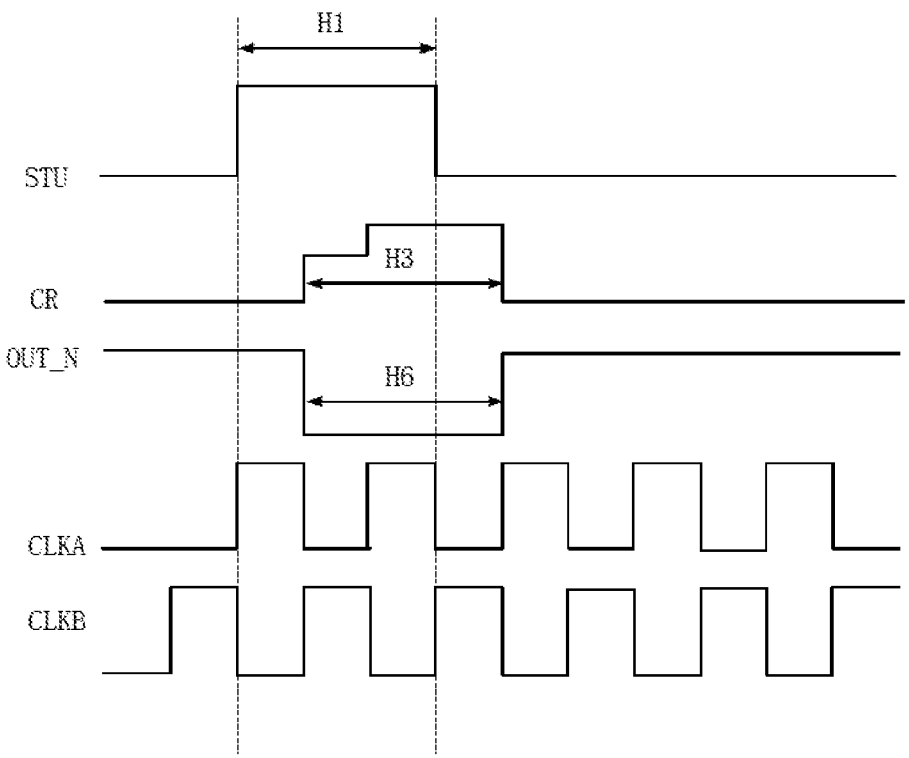
FIG. 9B is a timing chart of the respective signals of the shift register unit shown in FIG. 9A.

As shown in FIG. 9B, a width H6 of the reversed mono-pulse signal output at the driving signal output terminal OUT_N matches a pulse width of the output signal (e.g. the third output signal) outputted from the pulse width modulation module PWM. As described above, by adjusting the pulse width H1 of the first control signal STU, it is possible to adjust the pulse width of the output signal of the pulse width modulation module PWM, and therefore, by adjusting the pulse width H1 of the first control signal STU, it is possible to adjust the pulse width H6 of the reversed mono-pulse signal output at the driving signal output terminal OUT_N.

In addition, an amplitude of the reversed mono-pulse signal matches an amplitude of the fifth voltage signal VDD_H. Thus, by adjusting the amplitude of the fifth voltage signal VDD_H, it is possible to adjust the amplitude of the reversed mono-pulse signal outputted at the driving signal output terminal OUT_N.

Therefore, in the shift register unit of the sixth embodiment, the width and amplitude of the reversed mono-pulse signal can be adjusted, thus it is possible to provide corresponding control signals for OLED pixel circuits having different light emitting time or requirement in the light emitting stage.

According to the timing chart of the control signals shown in FIG. 9B, state of respective transistors in the reverse module 40 can be derived, and further a waveform diagram of the reversed mono-pulse signals output at the driving signal output terminal OUT_N can be derived.

Figure 10:
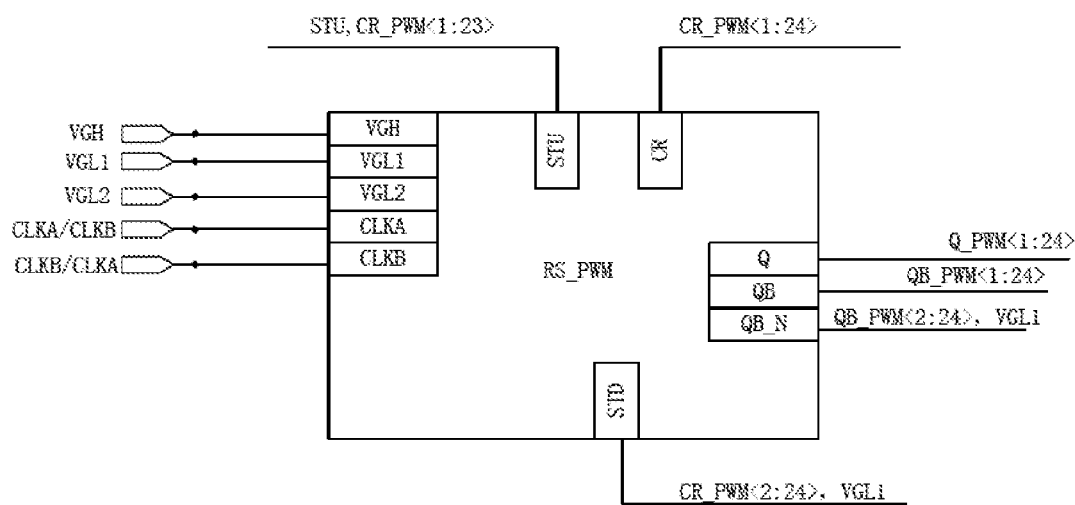
FIG. 10 is a schematic diagram of the gate driving circuit according to an embodiment of the present disclosure.

FIG. 10 shows a schematic diagram of the gate driving circuit according to an example embodiment. In the example embodiment, the gate driving circuit may include at least two cascaded shift register units. The shift register unit may be the shift register unit as shown in FIG. 1 through FIG. 4, FIG., FIG. 7C, FIG. 8A, and FIG. 9A.

As shown in FIG. 10, the gate driving circuit may include 24 cascaded shift register units. A first control signal terminal of a first stage of shift register unit is connected to a first control signal source capable of providing the first control signal. The first control signal terminal of other stage of shift register unit than the first stage of shift register unit is connected to the third output terminal of its previous stage of shift register unit. That is to say the first control signal STU of the first stage of shift register unit is provided by the first control signal source, and the third output signal CR of other stage of shift register unit than the last stage of shift register unit is used as the first control signal STU for its next stage of shift register unit.

In addition, the second control signal terminal of other stage of shift register unit than the last stage of shift register unit is connected to the third output terminal of its next stage of shift register unit. In addition, the second control signal terminal of the last stage of shift register unit is connected to the first voltage terminal. That is to say, the second control signal STD of the last stage of shift register unit is the first voltage signal VGL1, and the third output signal CR of other stage of shift register unit than the first stage of shift register unit is used as the second control signal STD for its previous stage of shift register unit.

In addition, the third control signal terminal of other stage of shift register unit than the last stage of shift register unit is connected to the second output terminal of its next stage of shift register unit. In addition, the third control signal terminal of the last stage of shift register unit is connected to the first voltage terminal. That is to say, the third control signal QB_N of the last stage of shift register unit is the first voltage signal VGL1, and the second output signal QB of other stage of shift register unit than the first stage of shift register unit is used as the third control signal QB_N for its previous stage of shift register unit.

Furthermore, the embodiments described herein further provide a display panel including the gate driving circuit as shown in FIG. 10.

In embodiments described herein, the display panel may be, for example, a liquid crystal display panel, a organic light emitting diode display panel. In addition, the display panel may be applied in a liquid crystal display, a liquid crystal television, a digital photo frame, a mobile phone, a tablet computer, or any product or component with display capability.

Several embodiments have been described in detail above, however, protection scope of the present disclosure is not limited thereto. It is apparent to those skilled in the art that various modifications, substitutions or variations may be made to the embodiments without departing from spirit and scope of the present disclosure. The protection scope is only defined by the accompany claims.

What is claimed is:

1. A shift register unit comprising a pulse width modulation module, wherein the pulse width modulation module comprises:
   a first input submodule configured to receive a first control signal via a first control signal terminal, to receive a second control signal via a second control signal terminal, to receive a third control signal via a third control signal terminal, to receive a second clock signal via a second clock signal terminal, to receive a first voltage signal via a first voltage terminal, and to output the first control signal as a first output signal via a first output terminal under the control of the second control signal and the third control signal;
   a first pull-down submodule configured to receive a first clock signal via a first clock signal terminal, to receive the first control signal and the first voltage signal, and to pull down a voltage of the first output signal to be equal to a voltage of the first voltage signal under the control of the first clock signal and the first control signal;
   a second input submodule configured to receive the first clock signal and the second clock signal and to output one of the first clock signal and the second clock signal as a second output signal via a second output terminal;
   a second pull-down submodule configured to receive the first output signal, the second output signal and the first voltage signal, and to pull down a voltage of the second output signal to be equal to a voltage of the first voltage signal under the control of the first output signal;
   a third input submodule configured to receive the first control signal, and the first output signal, to receive a third voltage signal via a third voltage terminal, and to output the third voltage signal as a third output signal via a third output terminal under the control of the first control signal and the first output signal; and
   a third pull-down submodule configured to receive the second output signal, the first voltage signal, and the third output signal, and to pull down a voltage of the third output signal to be equal to a voltage of the first voltage signal under the control of the second output signal.

2. The shift register unit according to claim 1, wherein the pulse width modulation module further includes:
   a feedback submodule configured to receive the first output signal, the second output signal, and the third voltage signal, to receive a second voltage signal via a second voltage terminal, and i) to output the third voltage signal to the first input submodule as a feedback signal under the control of the first output signal, or ii) to output the second voltage signal to the first pull-down submodule as a feedback signal under the control of the second output signal.

3. The shift register unit according to claim 1, wherein the first input submodule includes a first transistor, a second transistor and a third transistor;
    wherein a gate of the first transistor is connected to a second electrode of the second transistor, a first electrode of the first transistor is connected to the first output terminal, and a second electrode of the first transistor is connected to the first control signal terminal;
    wherein a gate of the second transistor is connected to the third control signal terminal, and a first electrode of the second transistor is connected to the second clock signal terminal; and
    wherein a gate of the third transistor is connected to the second control signal terminal, a first electrode of the third transistor is connected to the first voltage terminal, and a second electrode of the third transistor is connected to the second electrode of the second transistor.

4. The shift register unit according to claim 1, wherein the first pull-down submodule includes a sixth transistor, a seventh transistor, and an eighth transistor;
    wherein a gate of the sixth transistor is connected to a first electrode of the seventh transistor, a first electrode of the sixth transistor is connected to the first voltage terminal, and a second electrode of the sixth transistor is connected to the first output terminal;
    wherein a gate and a second electrode of the seventh transistor are each connected to the first clock signal terminal, and a first electrode of the seventh transistor is connected to a second electrode of the eighth transistor; and
    wherein a gate of the eighth transistor is connected to the first control signal terminal, and a first electrode of the eighth transistor is connected to the first voltage terminal.

5. The shift register unit according to claim 1, wherein the second input submodule includes a tenth transistor and a eleventh transistor,
    wherein a gate and a first electrode of the tenth transistor are each connected to the first clock signal terminal, and a second electrode of the tenth transistor is connected to the second output terminal; and
    wherein a gate and a second electrode of the eleventh transistor are each connected to the second clock signal terminal, and a first electrode of the eleventh transistor is connected to the second output terminal.

6. The shift register unit according to claim 1, wherein the second pull-down submodule includes a twelfth transistor, wherein a gate of the twelfth transistor is connected to the first output terminal, a first electrode of the twelve transistor is connected to the second output terminal, and a second electrode of the twelve transistor is connected to the first voltage terminal.

7. The shift register unit according to claim 1, wherein the third input submodule includes a first capacitor and a thirteenth transistor;
    wherein a gate of the thirteenth transistor is connected to the first output terminal, a first electrode of the thirteenth transistor is connected to the third voltage terminal, and a second electrode of the thirteenth transistor is connected to the third output terminal; and
    wherein the first capacitor is connected between the first control signal terminal and the gate of the thirteenth transistor.

8. The shift register unit according to claim 1, wherein the third pull-down submodule includes a second capacitor and a fourteenth transistor;
    wherein a gate of the fourteenth transistor is connected to the second output terminal, a first electrode of the fourteenth transistor is connected to the third output terminal, and a second electrode of the fourteenth transistor is connected to the first voltage terminal; and
    wherein the second capacitor is connected between the first output terminal and the gate of the fourteenth transistor.

9. The shift register unit according to claim 2, wherein the feedback submodule includes a fifteenth transistor and a sixteenth transistor;
    wherein a gate of the fifteenth transistor is connected to the first output terminal, a first electrode of the fifteenth transistor is connected to the third voltage terminal, and a second electrode of the fifteenth transistor is connected to the first input submodule and the first pull-down submodule; and
    wherein a gate of the sixteenth transistor is connected to the second output terminal, a second electrode of the sixteenth transistor is connected to the second voltage terminal, and a first electrode of the sixteenth transistor is connected to the first input submodule and the first pull-down submodule.

10. The shift register unit according to claim 9, wherein the first input submodule includes a first transistor, a second transistor, a third transistor, a fourth transistor and a fifth transistor;
    wherein a gate of the first transistor is connected to a second electrode of the second transistor, a first electrode of the first transistor is connected to a second electrode of the fifth transistor, and a second electrode of the first transistor is connected to the first control signal terminal;
    wherein a gate of the second transistor is connected to the third control signal terminal, and a first electrode of the second transistor is connected to the second clock signal terminal;
    wherein a gate of the third transistor is connected to the second control signal terminal, a first electrode of the third transistor is connected to the first voltage terminal, and a second electrode of the third transistor thereof is connected to the second electrode of the second transistor;
    wherein a gate of the fourth transistor is connected to the first clock signal terminal, a first electrode of the fourth transistor is connected to the second electrode of the second transistor, and a second electrode of the fourth transistor is connected to the first voltage terminal; and
    wherein a gate of the fifth transistor is connected to the second electrode of the second transistor, and a first electrode of the fifth transistor is connected to the first output terminal.

11. The shift register unit according to claim 9, wherein the first pull-down submodule includes a sixth transistor, a seventh transistor, an eighth transistor and a ninth transistor;
    wherein a gate of the sixth transistor is connected to a first electrode of the seventh transistor, a first electrode of the sixth transistor is connected to the first voltage terminal, and a second electrode of the sixth transistor is connected to a first electrode of the ninth transistor;
    wherein a gate and a second electrode of the seventh transistor are each connected to the first clock signal terminal, and a first electrode of the seventh transistor is connected to a second electrode of the eighth transistor;

wherein a gate of the eighth transistor is connected to the first control signal terminal, and a first electrode of the eighth transistor is connected to the first voltage terminal; and wherein a gate of the ninth transistor is connected to the first electrode of the seventh transistor, and a second electrode of the ninth transistor is connected to the first output terminal.

12. The shift register unit according to claim 1, further comprising a multi-pulse output module configured to be connected to the pulse width modulation module to receive the first output signal, the second output signal, and the third output signal, to receive a third clock signal via a third clock signal terminal, to receive a second voltage signal via a second voltage terminal, and to output a multi-pulse signal via a driving signal output terminal under the control of the first output signal, the second output signal, and the third output signal;

wherein a width of the multi-pulse signal matches a pulse width of one of the first output signal, the second output signal, and the third output signal, and a frequency of the multi-pulse signal matches a frequency of the third clock signal.

13. The shift register unit according to claim 12, wherein the multi-pulse output module includes a seventeenth transistor, an eighteenth transistor, a nineteenth transistor, a twentieth transistor, a twenty-first transistor and a third capacitor;

wherein a gate of the seventeenth transistor is connected to the first output terminal, a first electrode of the seventeenth transistor is connected to the third clock signal terminal, and a second electrode of the seventeenth transistor is connected to a second electrode of the eighteenth transistor;

wherein a gate of the eighteenth transistor is connected to the second output terminal, and a first electrode of the eighteenth transistor is connected to the second voltage terminal;

wherein a gate of the nineteenth transistor is connected to the third output terminal, a first electrode of the nineteenth transistor is connected to the first input submodule, and a second electrode of the nineteenth transistor is connected to the second electrode of the seventeenth transistor and the second electrode of the eighteenth transistor;

wherein a gate of the twentieth transistor is connected to the first output terminal, a first electrode of the twentieth transistor is connected to the third clock signal terminal, and a second electrode of the twentieth transistor is connected to the driving signal output terminal;

wherein a gate of the twenty-first transistor is connected to the second output terminal, a first electrode of the twenty-first transistor is connected to the second voltage terminal, and a second electrode of the twenty-first transistor is connected to the driving signal output terminal; and wherein the third capacitor is connected between the gate of the twentieth transistor and the driving signal output terminal.

14. The shift register unit according to claim 12, further comprising a gating module and a mono-pulse signal output module;

wherein one end of the gating module is connected to the multi-pulse output module, the other end is connected to the mono-pulse signal output module, and the gating module is configured to gate a mono-pulse signal outputted by the mono-pulse signal output module after gating a multi-pulse signal outputted by the multi-pulse output module.

15. The shift register unit according to claim 1, further comprising:

a multi-pulse output module configured to be connected to the pulse width modulation module to receive the first output signal and the second output signal and to receive a third clock signal via a third clock signal terminal and the first voltage signal, and to output a multi-pulse signal under the control of the first output signal and the second output signal; and a high frequency reverse module configured to be connected to the multi-pulse output module, to receive a fourth clock signal via a fourth clock signal terminal, to receive a third voltage signal via a third voltage terminal, the first voltage signal and a second voltage signal via a third voltage terminal, to reverse the multi-pulse signal under the control of the fourth clock signal, and to output the reversed multi-pulse signal via a driving signal output terminal;

wherein a width of the reversed multi-pulse signal matches a pulse width of one of the first output signal and the second output signal, and a frequency of the reversed multi-pulse signal matches a frequency of the third clock signal.

16. The shift register unit according to claim 15, wherein the multi-pulse output module includes a seventeenth transistor and an eighteenth transistor;

wherein a gate of the seventeenth transistor is connected to the first output terminal, a first electrode of the seventeenth transistor is connected to the third clock signal terminal, and a second electrode of the seventeenth transistor is connected to the high frequency reverse module; and wherein a gate of the eighteenth transistor is connected to the second output terminal, a first electrode of the eighteenth transistor is connected to the first voltage terminal, and a second electrode of the eighteenth transistor is connected to the high frequency reverse module.

17. The shift register unit according to claim 15, wherein the high frequency reverse module includes a nineteenth transistor, a twentieth transistor, a twenty-first transistor, a twenty-second transistor, a twenty-third transistor, a twenty-fourth transistor, a third capacitor, a fourth capacitor and a resistor;

wherein a gate of the nineteenth transistor is connected to the fourth clock signal terminal, a first electrode of the nineteenth transistor is connected to the third voltage terminal, and a second electrode of the nineteenth transistor is connected to a first electrode of the twentieth transistor;

wherein a gate of the twentieth transistor is connected to a gate of the twenty-first transistor and the multi-pulse output module, and a second electrode of the twentieth transistor is connected to the second voltage terminal;

wherein a first electrode of the twenty-first transistor is connected to the third voltage terminal, and a second electrode of the twenty-first transistor is connected to a gate of the twenty-fourth transistor;

wherein a gate of the twenty-second transistor is connected to the second electrode of the nineteenth transistor, a first electrode of the twenty-second transistor is connected to a gate of the twenty-fourth transistor, and a second electrode of the twenty-second transistor is connected to the first voltage terminal;

wherein a gate of the twenty-third transistor is connected to the second electrode of the nineteenth transistor, a first electrode of the twenty-third transistor is connected to the third voltage terminal, and a second electrode of the twenty-third transistor is connected to the driving signal output terminal;

wherein a first electrode of the twenty-fourth transistor is connected to the driving signal output terminal, and a second electrode of the twenty-fourth transistor is connected to the second voltage terminal;

wherein the third capacitor is connected between the gate of the twenty-third transistor and the second electrode of the twenty-third transistor; and wherein the resistor and the fourth capacitor are connected in series between the driving signal output terminal and a ground terminal.

18. The shift register unit according to claim 1, further including a reverse module configured to be connected to the pulse width modulation module to receive the first output signal and the second output signal, to receive a third clock signal via a third clock signal terminal, to receive a second voltage signal via a second voltage terminal, to receive a fifth voltage signal via a fifth voltage terminal, to receive the first voltage signal and a third voltage signal via a third voltage terminal, and to output a reversed mono-pulse signal via a driving signal output terminal under the control of the third voltage signal, the first output signal, and the second output signal;

wherein a width of the reversed mono-pulse signal matches a pulse width of one of the first output signal and the second output signal, and an amplitude of the reversed mono-pulse signal matches an amplitude of the fifth voltage signal.

19. The shift register unit according to claim 18, wherein the reverse module includes a seventeenth transistor, an eighteenth transistor, a nineteenth transistor, a twentieth transistor, a twenty-first transistor, a twenty-second transistor, a twenty-third transistor, a twenty-fourth transistor, a twenty-fifth transistor, a third capacitor, a fourth capacitor and a resistor;

wherein a gate of the seventeenth transistor is connected to the first output terminal, a first electrode of the seventeenth transistor is connected to the third clock signal terminal, and a second electrode of the seventeenth transistor is connected to a second electrode of the eighteenth transistor;

wherein a gate of the eighteenth transistor is connected to the second output terminal, and a first electrode of the eighteenth transistor is connected to the first voltage terminal;

wherein a gate and a first electrode of the nineteenth transistor are each connected to the third voltage terminal, and a second electrode of the nineteenth transistor is connected to a first electrode of the twentieth transistor;

wherein a gate of the twentieth transistor is connected to the second electrode of the seventeenth transistor and the second electrode of the eighteenth transistor, and a second electrode of the twentieth transistor is connected to the second voltage terminal;

wherein a gate and a first electrode of the twenty-first transistor are each connected to the third voltage terminal, and a second electrode of the twenty-first transistor is connected to the second electrode of the nineteenth transistor and the first electrode of the twentieth transistor;

wherein a gate of the twenty-second transistor is connected to the gate of the twentieth transistor, a first electrode of the twenty-second transistor is connected to the third voltage terminal, and a second electrode of the twenty-second transistor is connected to a first electrode of the twenty-third transistor;

wherein a gate of the twenty-third transistor is connected to the second electrode of the nineteenth transistor and the first electrode of the twentieth transistor, a first electrode of the twenty-third transistor is connected to the second electrode of the twenty-second transistor, and a second electrode of the twenty-third transistor is connected to the first voltage terminal;

wherein a gate of the twenty-fourth transistor is connected to the second electrode of the nineteenth transistor and the first electrode of the twentieth transistor, a first electrode of the twenty-fourth transistor is connected to the fifth voltage terminal, and a second electrode of the twenty-fourth transistor is connected to the driving signal output terminal;

wherein a gate of the twenty-fifth transistor is connected to the second electrode of the twenty-second transistor and the first electrode of the twenty-third transistor, a first electrode of the twenty-fifth transistor is connected to a fourth voltage terminal, and a second electrode of the twenty-fifth transistor is connected to the driving signal output terminal;

wherein the third capacitor is connected between gate of the twenty-fourth transistor and the second electrode of the twenty-fourth transistor; and wherein the resistor and the fourth capacitor are connected in series between the driving signal output terminal and a ground terminal.

20. A gate driving circuit comprising at least two cascaded shift register units according to claim 1;

wherein the first control signal for a first stage shift register unit in the at least two shift register units is provided by a first control signal source;

wherein the third output signal of a shift register unit other than a last stage shift register unit in the at least two shift register units is used as the first control signal for a next stage shift register unit;

wherein the third output signal of a shift register unit other than the first stage shift register unit in the at least two shift register units is used as the second control signal for a previous stage of shift register unit;

wherein the second control signal of the last stage shift register unit is the first voltage signal;

wherein the second output signal of a shift register unit other than the first stage shift register unit in the at least two shift register units is used as the third control signal for a previous stage shift register unit; and wherein the third control signal of the last stage shift register unit is the first voltage signal.

21. The gate driving circuit according to claim 20, wherein the pulse width modulation module further includes:

a feedback submodule configured to receive the first output signal, the second output signal, and a third voltage signal via a third voltage terminal, to receive a second voltage signal via a second voltage terminal, and i) to output the third voltage signal to the first input submodule as a feedback signal under the control of the first output signal, or ii) to output the second voltage signal to the first pull-down submodule as a feedback signal under the control of the second output signal.

22. The gate driving circuit according to claim 20, wherein the shift register unit further includes a multi-pulse output module configured to be connected to the pulse width modulation module to receive the first output signal, the second output signal and the third output signal, to receive a third clock signal via a third clock signal terminal, to receive the second voltage signal, and to output a multi-pulse signal via a driving signal output terminal under the control of the first output signal, the second output signal, and the third output signal; and wherein a width of the multi-pulse signal matches a pulse width of one of the first output signal, the second output signal, and the third output signal, and a frequency of the multi-pulse signal matches a frequency of the third clock signal.

23. The gate driving circuit according to claim 20, wherein the shift register unit further includes:

a multi-pulse output module configured to be connected to the pulse width modulation module to receive the first output signal and the second output signal, to receive a third clock signal via a third clock signal terminal and the first voltage signal, and to output a multi-pulse signal under the control of the first output signal and the second output signal; and a high frequency reverse module configured to be connected to the multi-pulse output module, to receive a fourth clock signal via a fourth clock signal terminal, to receive a third voltage signal via a third voltage terminal, the first voltage signal and a second voltage signal via a third voltage terminal, to reverse the multi-pulse signal under the control of the fourth clock signal, and to output the reversed multi-pulse signal via a driving signal output terminal;

wherein a width of the reversed multi-pulse signal matches a pulse width of one of the first output signal and the second output signal, and a frequency of the reversed multi-pulse signal matches a frequency of the third clock signal.

24. The gate driving circuit according to claim 20, wherein the shift register unit further includes a reverse module configured to be connected to the pulse width modulation module to receive the first output signal and the second output signal, to receive a third clock signal via a third clock signal terminal, to receive a second voltage signal via a second voltage terminal, to receive a fifth voltage signal via a fifth voltage terminal, to be-inputted receive the first voltage signal and the third voltage signal, and to output a reversed mono-pulse signal via a driving signal output terminal under the control of the third voltage signal, the first output signal, and the second output signal; and wherein a width of the reversed mono-pulse signal matches a pulse width of one of the first output signal and the second output signal, and an amplitude of the reversed mono-pulse signal matches an amplitude of the fifth voltage signal.

25. A display panel comprising the gate driving circuit according to claim 20.

* * * * *